(12) United States Patent
Wang et al.

(10) Patent No.: US 11,670,391 B2
(45) Date of Patent: Jun. 6, 2023

(54) SHIFT REGISTER AND DRIVING METHOD THEREOF, LIGHT-EMITTING CONTROL DRIVING CIRCUIT, AND DISPLAY APPARATUS

(71) Applicant: BOE TECHNOLOGY GROUP CO., LTD., Beijing (CN)

(72) Inventors: Li Wang, Beijing (CN); Guangliang Shang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 120 days.

(21) Appl. No.: 17/435,006

(22) PCT Filed: Sep. 28, 2020

(86) PCT No.: PCT/CN2020/118437
§ 371 (c)(1),
(2) Date: Aug. 30, 2021

(87) PCT Pub. No.: WO2022/061898
PCT Pub. Date: Mar. 31, 2022

(65) Prior Publication Data
US 2022/0319424 A1    Oct. 6, 2022

(51) Int. Cl.
*G11C 19/28*        (2006.01)
*G09G 3/3266*       (2016.01)

(52) U.S. Cl.
CPC ........... *G11C 19/28* (2013.01); *G09G 3/3266* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2017/0270851 | A1* | 9/2017 | Shang | G09G 3/2092 |
| 2018/0108289 | A1* | 4/2018 | Zheng | G09G 3/2092 |
| 2019/0385688 | A1* | 12/2019 | Fu | G09G 3/3674 |
| 2021/0134203 | A1* | 5/2021 | Wang | G09G 3/3677 |
| 2021/0358362 | A1* | 11/2021 | Zhang | G11C 19/287 |

* cited by examiner

*Primary Examiner* — Dorothy Harris
(74) *Attorney, Agent, or Firm* — IP & T Group LLP

(57) ABSTRACT

A shift register includes: an input circuit transmitting a first signal to a first node in response to a first clock signal and a second signal, transmitting the second signal to the first node in response to the first clock signal and the first signal; a first control circuit transmitting the first clock signal to a second node in response to the first node, transmitting a first voltage to the second node in response to the first clock signal; a second control circuit transmitting a second voltage to a third node in response to the first node, transmitting a second clock signal to the third node in response to the second node and the second clock signal; an output circuit transmitting the first voltage to a signal output terminal in response to the first node, transmitting the second voltage to the signal output terminal in response to the third node.

20 Claims, 12 Drawing Sheets

SHIFT REGISTER AND DRIVING METHOD THEREOF, LIGHT-EMITTING CONTROL DRIVING CIRCUIT, AND DISPLAY APPARATUS

CROSS-REFERENCE TO RELATED APPLICATION

This application is a national phase entry under 35 USC 371 of International Patent Application No. PCT/CN2020/118437 filed on Sep. 28, 2020, which is incorporated herein by reference in its entirety.

TECHNICAL HELD

The present disclosure relates to the field of display technologies, and in particular, to a shift register and a driving method thereof, a light-emitting control driving circuit, and a display apparatus.

BACKGROUND

Self-luminous devices are widely used in various kinds of terminal display products with high-resolution color screens due to their advantages such as high brightness, continuously adjustable color, low cost, quick response, low energy consumption, low driving voltage, wide operating temperature range, simple production process, and high luminous efficiency.

SUMMARY

In an aspect, a shift register is provided. The shift register includes an input circuit, a first control circuit, a second control circuit and an output circuit. The input circuit is coupled to a first signal input terminal, a second signal input terminal, a first clock signal terminal and a first node. The first control circuit is coupled to the first node, the first clock signal terminal, a first voltage terminal and a second node. The second control circuit is coupled to the first node, the second node, a second voltage terminal, a second clock signal terminal, and a third node. The output circuit is coupled to the first node, the third node, the first voltage terminal, the second voltage terminal and a signal output terminal.

The input circuit is configured to transmit a first signal received at the first signal input terminal to the first node in response to a first clock signal received at the first clock signal terminal and a second signal received at the second signal input terminal, and transmit the second signal received at the second signal input terminal to the first node in response to the first clock signal received at the first clock signal terminal and the first signal received at the first signal input terminal.

The first control circuit is configured to transmit the first clock signal received at the first clock signal terminal to the second node in response to a voltage of the first node, and transmit a first voltage of the first voltage terminal to the second node in response to the first clock signal.

The second control circuit is configured to transmit a second voltage of the second voltage terminal to the third node in response to the voltage of the first node, and transmit a second clock signal to the third node in response to a voltage of the second node and the second clock signal received at the second clock signal terminal.

The output circuit is configured to transmit the first voltage of the first voltage terminal to the signal output terminal in response to the voltage of the first node, and transmit the second voltage of the second voltage terminal to the signal output terminal in response to a voltage of the third node.

In some embodiments, the input circuit includes a first input sub-circuit, a second input sub-circuit and a third input sub-circuit. The first input sub-circuit is coupled to the first signal input terminal, the second signal input terminal and the third input sub-circuit. The second input sub-circuit is coupled to the first signal input terminal, the second signal input terminal and the third input sub-circuit. The third input sub-circuit is further coupled to the first clock signal terminal and the first node.

The first input cub-circuit is configured to transmit the second signal to the third input sub-circuit in response to the first signal. The second input cub-circuit is configured to transmit the first signal to the third input sub-circuit in response to the second signal. The third input sub-circuit is configured to transmit the second signal from the first input sub-circuit to the first node in response to the first clock signal, and transmit the first signal from the second input sub-circuit to the first node in response to the first clock signal.

In some embodiments, the first input sub-circuit includes a first transistor. A control electrode of the first transistor is coupled to the first signal input terminal, a first electrode of the first transistor is coupled to the second signal input terminal, and a second electrode of the first transistor is coupled to the third input sub-circuit.

In some embodiments, the second input sub-circuit includes a second transistor. A control electrode of the second transistor is coupled to the second signal input terminal, a first electrode of the second transistor is coupled to the first signal input terminal, and a second electrode of the second transistor is coupled to the third input sub-circuit.

In some embodiments, the third input sub-circuit includes a third transistor. A control electrode of the third transistor is coupled to the first clock signal terminal, a first electrode of the third transistor is coupled to the first input sub-circuit and the second input sub-circuit, and a second electrode of the third transistor is coupled to the first node.

In some embodiments, the third input sub-circuit includes a fourth transistor and a fifth transistor. A control electrode of the fourth transistor is coupled to the first clock signal terminal, a first electrode of the fourth transistor is coupled to the first input sub-circuit, and a second electrode of the fourth transistor is coupled to the first node. A control electrode of the fifth transistor is coupled to the first clock signal terminal, a first electrode of the fifth transistor is coupled to the second input sub-circuit, and a second electrode of the fifth transistor is coupled to the first node.

In some embodiments, the output circuit includes a first output sub-circuit and a second output sub-circuit. The first output sub-circuit is coupled to the third node, the second voltage terminal and the signal output terminal. The second output sub-circuit is coupled to the first node, the first voltage terminal and the signal output terminal. The first output sub-circuit is configured to transmit the second voltage to the signal output terminal in response to the voltage of the third node. The second output sub-circuit is configured to transmit the first voltage to the signal output terminal in response to the voltage of the first node;

In some embodiments, the first output sub-circuit includes a sixth transistor and a first capacitor. A control electrode of the sixth transistor is coupled to the third node, a first electrode of the sixth transistor is coupled to the second voltage terminal, and a second electrode of the sixth transistor is coupled to the signal output terminal. A first terminal of the first capacitor is coupled to the third node, and a second terminal of the first capacitor is coupled to the second voltage terminal.

In some embodiments, the second output sub-circuit includes a seventh transistor. A control electrode of the seventh transistor is coupled to the first node, a first electrode of the seventh transistor is coupled to the first voltage terminal, and a second electrode of the seventh transistor is coupled to the signal output terminal.

In some embodiments, the first control circuit includes a first control sub-circuit and a second control sub-circuit. The first control sub-circuit is coupled to the first clock signal terminal, the first voltage terminal and the second node. The second control sub-circuit is coupled to the first node, the first clock signal terminal and the second node. The first control sub-circuit is configured to transmit the first voltage to the second node in response to the first clock signal. The second control sub-circuit is configured to transmit the first clock signal to the second node in response to the voltage of the first node.

In some embodiments, the first control sub-circuit includes an eighth transistor. A control electrode of the eighth transistor is coupled to the first clock signal terminal, a first electrode of the eighth transistor is coupled to the first voltage terminal, and a second electrode of the eighth transistor is coupled to the second node.

In some embodiments, the second control sub-circuit includes a ninth transistor. A control electrode of the ninth transistor is coupled to the first node, a first electrode of the ninth transistor is coupled to the first clock signal terminal, and a second electrode of the ninth transistor is coupled to the second node.

In some embodiments, the second control circuit includes a third control sub-circuit and a fourth control sub-circuit. The third control sub-circuit is coupled to the first node, the third node and the second voltage terminal. The fourth control sub-circuit is coupled to the second node, the second clock signal terminal and the third node.

The third control sub-circuit is configured to transmit the second voltage to the third node in response to the voltage of the first node. The fourth control sub-circuit is configured to transmit the second clock signal to the third node in response to the voltage of the second node and the second clock signal.

In some embodiments, the third control sub-circuit includes a tenth transistor. A control electrode of the tenth transistor is coupled to the first node, a first electrode of the tenth transistor is coupled to the second voltage terminal, and a second electrode of the tenth transistor is coupled to the third node.

In some embodiments, the fourth control sub-circuit includes an eleventh transistor, a twelfth transistor and a second capacitor. A control electrode of the eleventh transistor is coupled to the second node, and a first electrode of the eleventh transistor is coupled to the second clock signal terminal. A control electrode of the twelfth transistor is coupled to the second clock signal terminal, a first electrode of the twelfth transistor is coupled to a second electrode of the eleventh transistor, and a second electrode of the twelfth transistor is coupled to the third node. A first terminal of the second capacitor is coupled to the second node, and a second terminal of the second capacitor is coupled to the second electrode of the eleventh transistor and the first electrode of the twelfth transistor.

In some embodiments, the shift register further includes a third control circuit. The third control circuit is coupled to the second node, the second voltage terminal, the first node, and the second clock signal terminal. The third control circuit is configured to transmit the second voltage of the second voltage terminal to the first node in response to the voltage of the second node and the second clock signal received at the second clock signal terminal.

In some embodiments, the third control circuit includes a thirteenth transistor and a fourteenth transistor. A control electrode of the thirteenth transistor is coupled to the second node, and a first electrode of the thirteenth transistor is coupled to the second voltage terminal. A control electrode of the fourteenth transistor is coupled to the second clock signal terminal, a first electrode of the fourteenth transistor is coupled to a second electrode of the thirteenth transistor, and a second electrode of the fourteenth transistor is coupled to the first node.

In some embodiments, the shift register further includes a fourth control circuit. The fourth control circuit is coupled to the first node and the second clock signal terminal. The fourth control circuit is configured to control the voltage of the first node according to the second clock signal received at the second clock signal terminal.

In some embodiments, the fourth control circuit includes a third capacitor. A first terminal of the third capacitor is coupled to the second clock signal terminal, and a second terminal of the third capacitor is coupled to the first node.

In another aspect, a light-emitting control driving circuit is provided. The light-emitting control driving circuit includes a plurality of shift registers connected in cascade. A first-stage shift register of the plurality of shift registers connected in cascade is the shift register as described in any of the above embodiments.

In yet another aspect, a display apparatus is provided. The display apparatus includes the light-emitting control driving circuit as described in the above embodiment.

In some embodiments, the display apparatus further includes a processor and a controller. The processor is coupled to the controller. The controller is further coupled to the light-emitting control driving circuit. The processor is configured to output a first control signal and a second control signal to the controller.

The controller is configured to transmit the first signal and the second signal to the light-emitting control driving circuit in response to the first control signal. In a period of a frame, the first signal has a plurality of first pulses, the second signal has a plurality of second pulses, and a first pulse and a second pulse do not overlap at a same moment.

The controller is further configured to transmit the first signal and the second signal to the light-emitting control driving circuit in response to the second control signal. In a period of a frame, the first signal has a plurality of first pulses, and the second signal is a direct current signal.

In some embodiments, the processor is configured to output the first control signal to the controller in response to an operation of launching a specific application in a case where the specific application belongs to a preset collection, and output the second control signal to the controller in response to the operation of launching the specific application in a case where the specific application does not belong to the preset collection. The preset collection includes at least one application.

In yet another aspect, a driving method of a shift register is provided. The shift register includes: an input circuit, a first control circuit, a second control circuit, and an output circuit. The input sub-circuit is coupled to a first signal input terminal, a second signal input terminal, a first clock signal terminal and a first node. The first control circuit is coupled to the first node, the first clock signal terminal, a first voltage terminal and a second node. The second control circuit is coupled to the first node, the second node, a second voltage terminal, a second clock signal terminal, and a third node. The output circuit is coupled to the first node, the third node, the first voltage terminal, the second voltage terminal and a signal output terminal.

The driving method includes:

transmitting, by the input circuit, a first signal received at the first signal input terminal to the first node in response to a first clock signal received at the first clock signal terminal and a second signal received at the second signal input terminal; and transmitting, by the input circuit, the second signal received at the second signal input terminal to the first node in response to the first clock signal received at the first clock signal terminal and the first signal received at the first signal input terminal;

transmitting, by the first control circuit, the first clock signal received at the first clock signal terminal to the second node in response to a voltage of the first node; and transmitting, by the first control circuit, a first voltage of the first voltage terminal to the second node in response to the first clock signal;

transmitting, by the second control circuit, a second voltage of the second voltage terminal to the third node in response to the voltage of the first node; and transmitting, by the second control circuit, a second clock signal to the third node in response to a voltage of the second node and the second clock signal received at the second clock signal terminal; and transmitting, by the output circuit, the first voltage of the first voltage terminal to the signal output terminal in response to the voltage of the first node; and transmitting, by the output circuit, the second voltage of the second voltage terminal to the signal output terminal in response to a voltage of the third node.

In a period of a frame, the first signal has a plurality of first pulses, the second signal has a plurality of second pulses, and first pulse and second pulse do not overlap at a same moment.

In some embodiments, the plurality of first pulses and the plurality of second pulses are both arranged periodically. An interval between the second pulse and the first pulse adjacent to the second pulse is approximately half of an interval between two adjacent first pulses.

In some embodiments, in the period of the frame, a number of the plurality of first pulses and a number of the plurality of second pulses are both four. An interval between the second pulse and the first pulse adjacent to the second pulse is approximately one-eighth of a duration of the period of the frame.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual dimensions of products, actual processes of methods and actual timings of signals involved in the embodiments of the present disclosure.

DETAILED DESCRIPTION

Figure 1A:
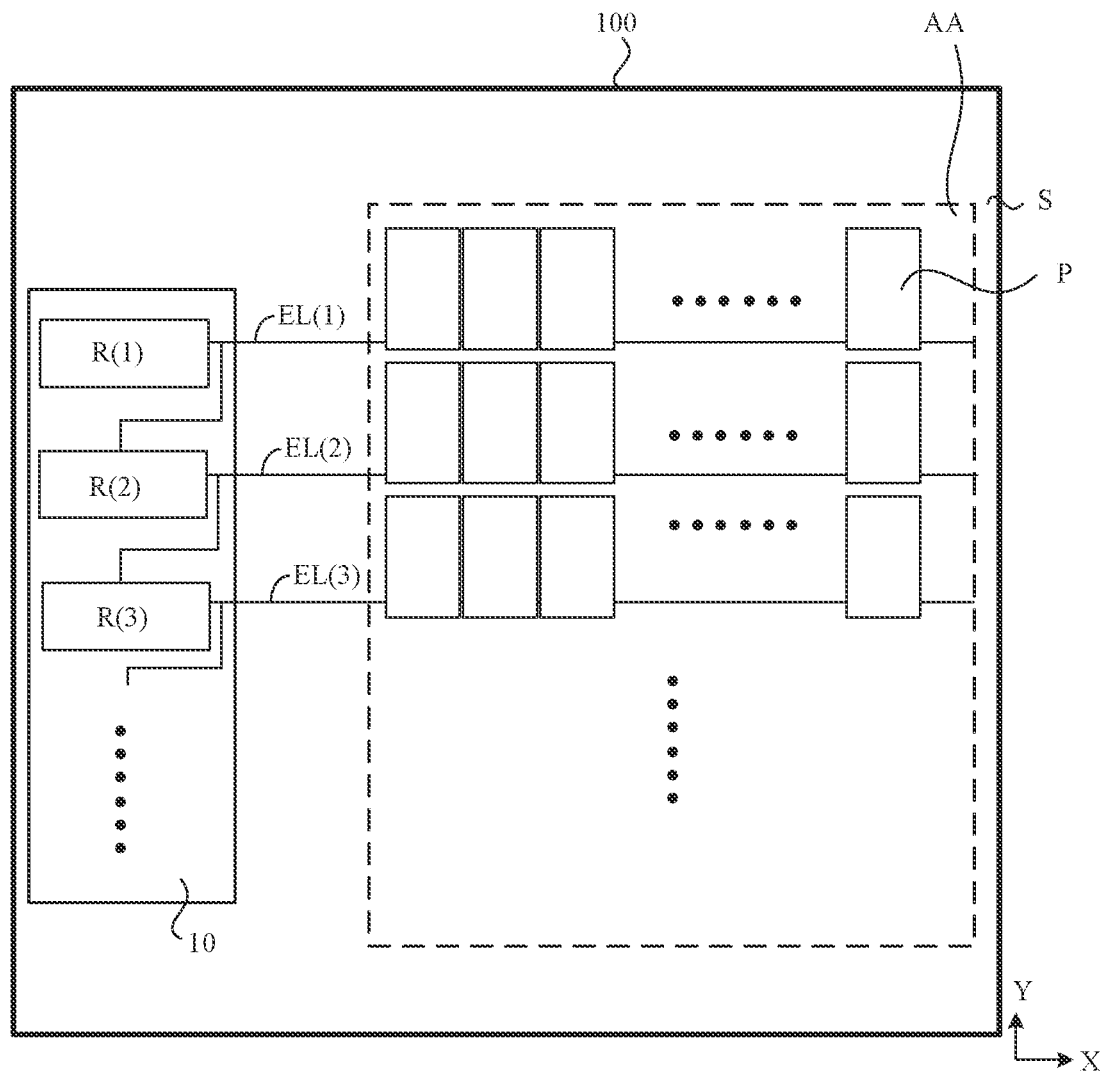
FIG. 1A is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example" "specific example or some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying the relative importance or implicitly indicating the number of indicated technical features. Thus, features defined with "first" and "second" may explicitly or implicitly include one or more of the features. In the description of the embodiments of the present disclosure, "a plurality of" or "the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The use of "applicable to" or "configured to" herein means an open and inclusive expression, which does not exclude devices that are applicable to or configured to perform additional tasks or steps.

The term "about" or "approximately" as used herein includes a stated value and an average value within an acceptable range of deviation of a particular value. The acceptable range of deviation is determined by a person of ordinary skill in the art in view of the measurement in question and the error associated with measurement of a particular amount (i.e., the limitations of the measurement system).

Embodiments of the present disclosure provide a display apparatus. For example, the display apparatus may be any apparatus that displays images whether in motion (such as a video) or fixed (such as a still image), and regardless of text or image. More specifically, the display apparatus may be one of a variety of electronic devices, and the described embodiments may be implemented in or associated with a variety of electronic devices. The variety of electronic devices may include (but are not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, and packaging and aesthetic structures (e.g., displays for displaying an image of a piece of jewelry), etc. Embodiments of the present disclosure do not particularly limit a specific form of the display apparatus.

Figure 1B:
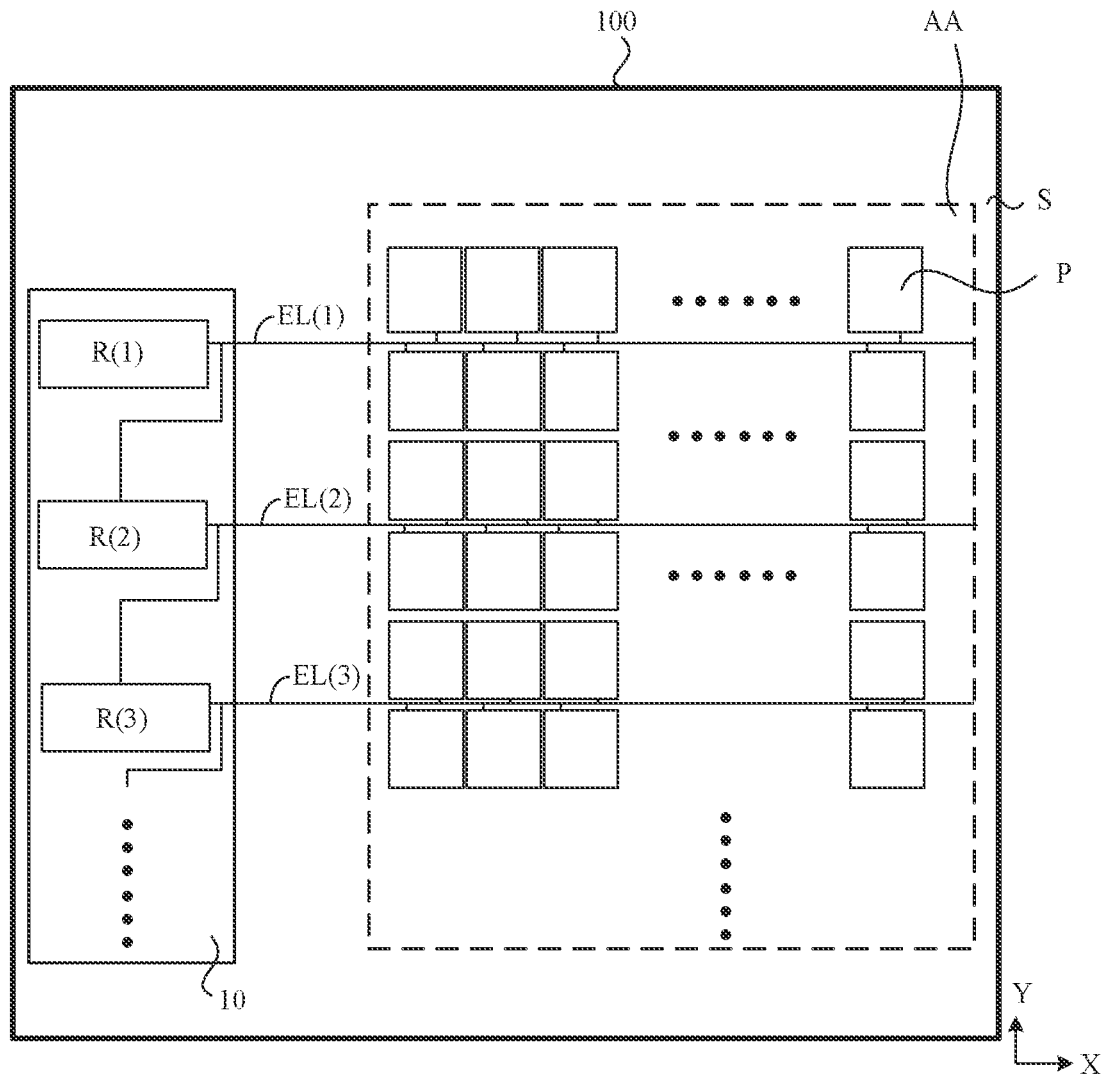
FIG. 1B is a structural diagram of another display apparatus, in accordance with some embodiments.

For example, as shown in FIGS. 1A and 1B, the display apparatus 200 includes a display panel 100. The display panel 100 has a display area (also called an active area (AA)) and a peripheral area S located at least at one side of the active area AA.

Figure 2:
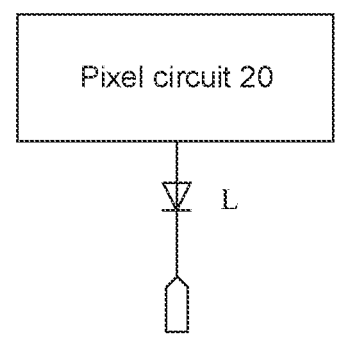
FIG. 2 is a structural diagram of a sub-pixel, in accordance with some embodiments.

As shown in FIGS. 1A and 1B, the display panel 100 includes a plurality of sub-pixels P disposed in the active area AA. As shown in FIG. 2, at least one sub-pixel P (e.g., each sub-pixel P) includes a pixel circuit 20 and a light-emitting device L. The pixel circuit 20 is coupled to the light-emitting device L. The pixel circuit 20 is configured to drive the light-emitting device L to emit light.

It will be noted that, the arrangement of sub-pixels can be designed according to actual conditions, which is not limited herein. For example, as shown in FIGS. 1A and 1B, the plurality of sub-pixels P are arranged in an array. Sub-pixels P arranged in a line along an X direction are referred to sub-pixels in the same row, and sub-pixels P arranged in a line along a Y direction are referred to sub-pixels in the same column.

In addition, the specific structure of the pixel circuit is not limited in the embodiments of the present disclosure, which can be designed according to actual conditions. In some examples, the pixel circuit is composed of thin film transistors (abbreviated as TFTs), capacitor(s) (abbreviated as C(s)), and other electronic devices. For example, the pixel circuit includes two thin film transistors (one switching transistor and one driving transistor) and one capacitor, which form a 2T1C structure. Of course, the pixel circuit may also include more than two thin film transistors (a plurality of switching transistors and one driving transistor) and at least one capacitor. For example, referring to FIG. 3, the pixel circuit 20 includes a capacitor Cst and seven transistors (six switching transistors M1, M2, M3, M5, M6 and M7, and one driving transistor M4), which form a 7T1C structure.

Figure 3:
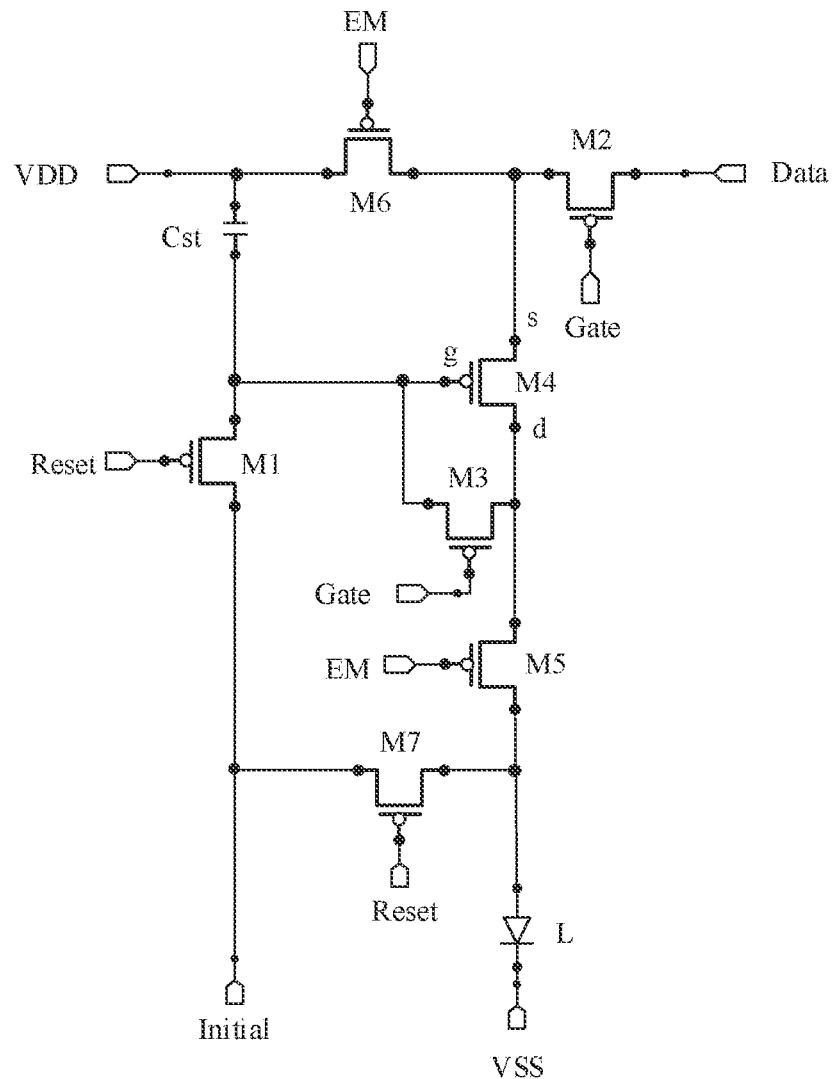
FIG. 3 is a structural diagram of a pixel circuit, in accordance with some embodiments.
Figure 4:
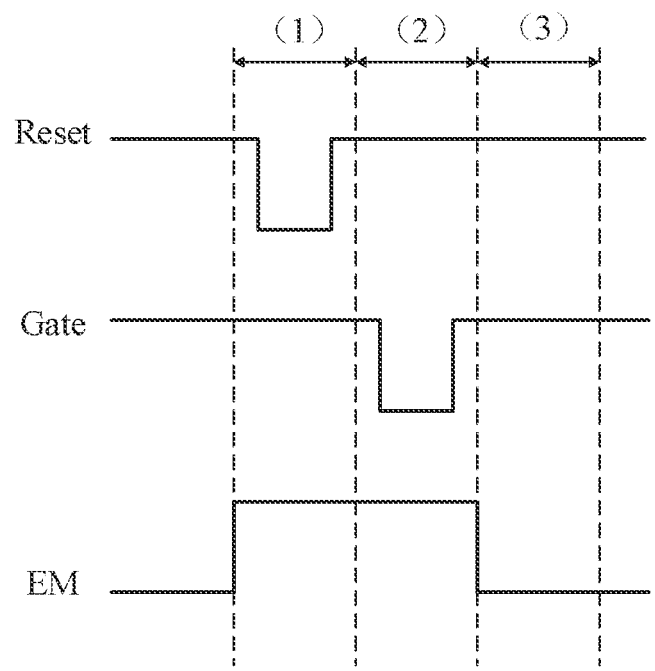
FIG. 4 is a timing diagram of signals for driving a pixel circuit, in accordance with some embodiments.

For example, as shown in FIG. 3, the control electrodes (gates) of some switching transistors (e.g., M1 and M7) are used to receive a reset signal Reset as shown in FIG. 4; the control electrodes of some other switching transistors (e.g., M2 and M3) are used to receive a gate driving signal Gate as shown in FIG. 4; and the control electrodes of yet some other switching transistors (e.g., M5 and M6) are used to receive a light-emitting control signal EM as shown in FIG. 4. An operating process of the pixel circuit shown in FIG. 3 includes three periods shown in FIG. 4, namely, a first period (1), a second period (2) and a third period (3). For example, in the first period (1), the transistor M1 and the transistor M7 are turned on in response to the reset signal Reset. An initialization signal Initial is transmitted to a control electrode (g) of the driving transistor M4 and an anode of the light-emitting device L through the transistor M1 and the transistor M7, respectively, so as to achieve the purpose of resetting the anode of the light-emitting device L and the control electrode of the driving transistor M4. In the second period (2), the transistor M3 is turned on under the control of the gate driving signal Gate, and the control electrode g of the driving transistor M4 is coupled to a drain (d) thereof, so that the driving transistor M4 is in a turned-on state of a diode. In this case, a data signal Data is written to a source (s) of the driving transistor M4 through the transistor M2, so as to compensate a threshold voltage (Vth) of the driving transistor M4. In the third period (3) the transistor M5 and the transistor M6 are turned on under the control of the light-emitting control signal EM, and a current path between a first power supply signal VDD and a second power supply signal VSS is turned on. The driving current ($I_{sd}$) generated by the driving transistor M4 is transmitted to the light-emitting device L through the current path, so as to drive the light-emitting device L to emit light.

Figure 5:
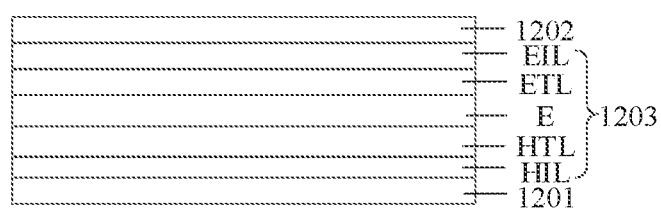
FIG. 5 is a structural diagram of a light-emitting device, in accordance with some embodiments.

For example, the light-emitting device may be a current-driven light-emitting device such as a light-emitting diode (LED) or an organic light-emitting diode (OLED). In some examples, as shown in FIG. 5, the light-emitting device L includes a cathode 1202, an anode 1201, and a light-emitting functional layer 1203 between the cathode 1202 and the anode 1201. The light-emitting functional layer 1203 may include, for example, a light-emitting layer E, a hole transporting layer (HTL) between the light-emitting layer E and the anode 1201, and an electron transporting layer (ETL) between the light-emitting layer E and the cathode 1202. Of course, according to needs, in some embodiments, a hole injection layer (HIL) may further be provided between the hole transporting layer HTL and the anode, and an electron injection layer (EIL) may further be provided between the electron transporting layer ETL and the cathode 1202.

In some examples, the anode may be, for example, made of a transparent conductive material with high work function, and an electrode material thereof may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc. The cathode may be, for example, made of a material with high conductivity and low work function, and an electrode material thereof may include magnesium aluminum (MgAl) alloy, lithium aluminum (LiAl) alloy, and other alloys, or magnesium (Mg), aluminum (Al), lithium (Li), silver (Ag) and other pure metals. A material of the light-emitting layer may be selected according to a color of the light emitted by the light-emitting layer. For example, the material of the light-emitting layer includes a fluorescent light-emitting material or a phosphorescent light-emitting material. For example, in at least one embodiment of the present disclosure, the light-emitting layer adopts a doping system, which means that a host light-emitting material is doped with a dopant material to obtain a usable light-emitting material. For example, the host light-emitting material may be a metallic compound material, an anthracene derivative, an aromatic diamine compound, a triphenylamine compound, an aromatic triamine compound, a benzidine diamine derivative, a triarylamine polymer, and the like.

Since a brightness of an environment where the display apparatus is located is different under different external conditions, the display apparatus needs to adjust a display brightness to ensure that the users can watch the display content normally. For example, the display apparatus may adopt a dimming method of pulse width modulation (PWM), in which a screen is controlled to alternate between bright and dark, so that the screen may display different brightness to realize the adjustment of the display brightness. That is, multiple black frame insertions are performed on the screen, and durations of the black frame insertions are adjusted to change the brightness of display. For example, by performing PWM on the light-emitting control signal, multiple black frame insertions are performed on the light-emitting device in the period of a frame, so as to control a light-emitting duration of the light-emitting device to change the brightness of the screen. However, due to the limitations of the internal circuits of the display apparatus, for example, an integrated circuit (IC) may only be able to support a limited number of black frame insertions, the number of black frame insertions performed on the display apparatus is small. As a result, s difficult to achieve a high refresh frequency (e.g., 1 KHz). Consequently, in some application scenarios, such as scanning codes or taking pictures, since the number of black frame insertions is small, the display apparatus is prone to identification abnormalities.

Figure 6A:
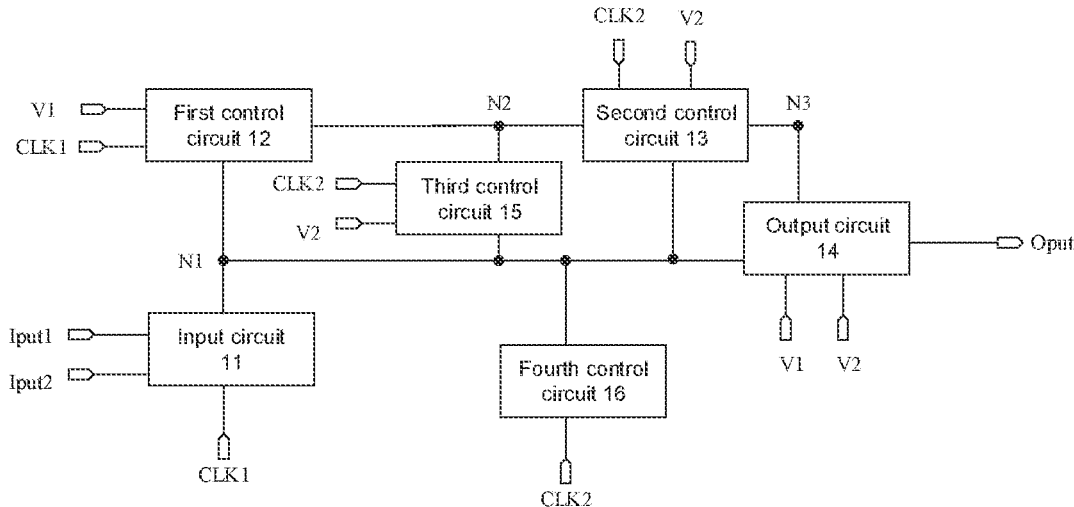
FIG. 6A is a structural diagram of a shift register, in accordance with some embodiments.

Embodiments of the present disclosure provide a shift register SR. As shown in FIG. 6A, the shift register SR includes: an input circuit 11, a first control circuit 12, a second control circuit 13 and an output circuit 14.

The input circuit 11 is coupled to a first signal input terminal Iput1, a second signal input terminal Iput2, a first clock signal terminal CLK1 and a first node N1. The first control circuit 12 is coupled to the first node N1, the first clock signal terminal CLK1, a first voltage terminal V1 and a second node N2. The second control circuit 13 is coupled to the first node N1, the second node N2, a second voltage terminal V2, a second clock signal terminal CLK2 and a third node N3. The output circuit 14 is coupled to the first node N1, the third node N3, the first voltage terminal V1, the second voltage terminal V2, and a signal output terminal Oput.

The input circuit 11 is configured to transmit a first signal received at the first signal input terminal Iput1 to the first node N1 in response to a first clock signal received at the first clock signal terminal CLK1 and a second signal received at the second signal input terminal Iput2, and transmit the second signal received at the second signal input terminal Iput2 to the first node N1 in response to the first clock signal received at first clock signal terminal CLK1 and the first signal received at the first signal input terminal Iput1.

The output circuit 14 is configured to transmit a first voltage of the first voltage terminal V1 to the signal output terminal Oput in response to a voltage of the first node N1, and transmit a second voltage of the second voltage terminal V2 to the signal output terminal Oput in response to a voltage of the third node N3.

The first control circuit 12 is configured to transmit the first clock signal received at the first clock signal terminal CLK1 to the second node N2 in response to the voltage of the first node N1, and transmit the first voltage of the first voltage terminal V1 to the second node N2 in response to the first clock signal. In this way, the first control circuit 12 may be able to control the voltage of the second node N2.

The second control circuit 13 is configured to transmit the second voltage of the second voltage terminal V2 to the third node N3 in response to the voltage of the first node N1, and transmit a second clock signal to the third node N3 in response to the voltage of the second node N2 and the second clock signal received at the second clock signal terminal CLK2. In this way, the second control circuit 13 may be able to control the voltage of the third node N3, so that the output circuit 14 outputs the second voltage steadily, so as to ensure the stability and reliability of the signal output by the signal output terminal Oput.

For example, the first voltage of the first voltage terminal V1 is a direct current voltage, such as a low direct current voltage (VOL). For example, the first voltage is −7 V. For example, the second voltage of the second voltage terminal V2 is a direct current voltage, such as a high direct current voltage (VGH). For example, the second voltage is 7 V.

At different moments, the output circuit 14 transmits the first voltage and the second voltage to the signal output terminal Oput, and the signal output terminal Oput outputs the first voltage and the second voltage to the pixel circuit. Correspondingly, voltages of the light-emitting control signal are the first voltage and the second voltage. For example, the shift register SR transmits the low-level first voltage to the signal output terminal Oput. In this case, the output signal of the signal output terminal Oput is a low-level signal. That is, the light-emitting control signal EM is a low-level signal. For example, the voltage of the light-emitting control signal EM is the first voltage. In this way, referring to FIG. 3, the transistors M5 and M6 in the pixel circuit 20 are turned on in response to the low-level light-emitting control signal EM, and transmit the driving signal to the light-emitting device L to drive the light-emitting device L to emit light. For example, the shift register SR transmits the high-level second voltage to the signal output terminal Oput. In this case, the output signal of the signal output terminal Oput is a high-level signal. That is, the light-emitting control signal EM is a high-level signal. For example, the voltage of the light-emitting control signal EM is the second voltage. In this way, referring to FIG. 3, the transistors M5 and M6 in the pixel circuit 20 are turned off in response to the high-level light-emitting control signal EM, and will not transmit the driving signal to the light-emitting device L; therefore, the light-emitting device L does not emit light.

In some examples, a duty cycle of the first signal received at the first signal input terminal Iput1 and a duty cycle of the second signal received at the second signal input terminal Iput2 are approximately the same. For example, the first signal and the second signal have a phase difference. For example, the first signal and the second signal will not be high level signals at the same time.

In some examples, the second clock signal and the first clock signal are inverted signals of each other. For example, a phase difference between the second clock signal and the first clock signal is 180°. For example, in a case where the first clock signal is a low level signal, the second clock signal is a high level signal; and in a case where the first clock signal is a high level signal, the second clock signal is a low level signal.

For example, in a period of a frame, the first signal has a plurality of first pulses, and the second signal has a plurality of second pulses. The first pulse and the second pulse do not overlap at a same moment. For example, the second pulse is delayed from the first pulse. For example, the number of first pulses of the first signal and the number of second pulses of the second signal are equal. For example, both the first pulse and the second pulse are arranged periodically. An interval between two adjacent first pulses of the first signal is approximately equal to an interval between two adjacent second pulses of the second signal; and an interval between the second pulse and the first pulse adjacent to the second pulse is approximately half of the interval between two adjacent first pulses. For example, the interval between two adjacent first pulses of the first signal is approximately u, and the interval between the first pulse of the first signal and the second pulse, adjacent to the second pulse, of the second signal is approximately half of u (u/2). That is, the second pulse of the second signal is delayed by approximately half of u (u/2) compared to the first pulse, adjacent to the second pulse, of the first signal. For example, the phase difference between the first signal and the second signal adjacent to the second pulse is approximately half of the interval between two adjacent first pulses of the first signal. For example, in the period of a frame, in a case where the number of first pulses of the first signal and the number of second pulses of the second signal are both four, and the duration of the period of a frame is approximately t, then the interval between two adjacent first pulses of the first signal (i.e., a duration of a period of the first signal) is approximately a quarter of t (t/4), the interval between two adjacent second pulses of the second signal (i.e., a duration of a period of the second signal) is approximately a quarter of t (t/4), and the second pulse of the second signal is delayed from the first pulse, adjacent to the second pulse, of the first signal by a duration of approximately one-eighth of t (t/8). That is, a phase of the second signal is delayed from a phase of the first signal by a duration of approximately one-eighth of t (t/8).

It will be understood that, the input circuit transmits the first signal to the first node, and after a preset time period, the input circuit transmits the second signal to the first node. The preset time period refers to the duration by which the phase of the second signal is delayed from the phase of the first signal. For example, the duration by which the phase of the second signal is delayed from the phase of the first signal by approximately one-eighth of t (t/8), then the preset time period is one-eighth of t (t/8).

In this case, the input circuit in the shift register may transmit the first signal and the second signal to the first node at different moments, the first control circuit may control the voltage of the second node, and the second control circuit may control the voltage of the third node. Therefore, the output circuit transmits the first voltage to the signal output terminal, and the signal output terminal outputs the light-emitting control signal, so that the light-emitting device emits light normally, and the display panel is in a bright state. In addition, the output circuit transmits the second voltage to the signal output terminal, so that the light-emitting device does not emit light, and the display panel is in a dark state. That is, a black frame insertion is performed. Thus, the display panel alternates between bright and dark states, and the overall brightness of the display panel is adjusted. Moreover, the shift register provided in the embodiments of the present disclosure transmits the second voltage to the signal output terminal at different moments upon receiving the first signal and the second signal. Compared with a case where the shift register transmits the second voltage to the signal output terminal only upon receiving the first signal, the number of times the second voltage is transmitted to the signal output terminal is increased, thus the number of times the signal output terminal outputs a black frame insertion signal is increased, and the number of times the display panel performs black frame insertions according to the outputted signal is increased. In this way, the frequency of the signal output by the signal output terminal is multiplied, which improves the refresh frequency of the display panel.

Therefore, in the shift register provided in the embodiments of the present disclosure, the input circuit transmits the first signal to the first node in response to the first clock signal and the second signal, and transmits the second signal to the first node in response to the first clock signal and the first signal. The first control circuit transmits the first voltage to the second node in response to the first clock signal, and transmits the first clock signal to the second node in response to the voltage of the first node. The second control circuit transmits the second clock signal to the third node in response to the voltage of the second node and the second clock signal, and transmits the second voltage to the third node in response to the voltage of the first node. The output circuit transmits the first voltage to the signal output terminal in response to the voltage of the first node, and transmits the second voltage to the signal output terminal in response to the voltage of the third node. In this way, the shift register transmits the second voltage to the signal output terminal at different moments upon receiving the first signal and the second signal, thereby increasing the number of times the second voltage is transmitted to the signal output terminal, increasing the number of times the signal output terminal outputs the black frame insertion signal, and increasing the number of times the display panel performs black frame insertion according to the outputted signal. In this way, the frequency of the signal output by the signal output terminal is multiplied, which improves the refresh frequency of the display panel.

Figure 6B:
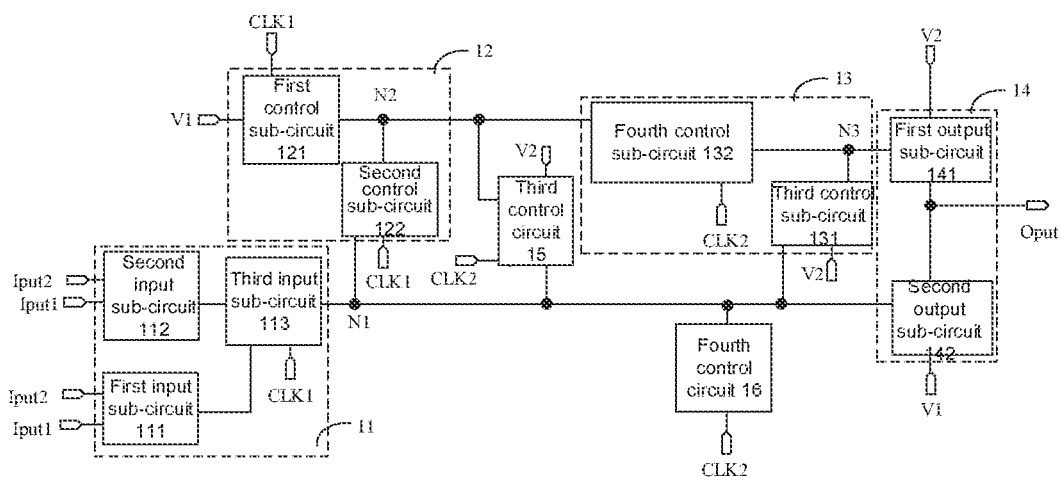
FIG. 6B is a structural diagram of another shift register, in accordance with some embodiments.

In some embodiments, as shown in FIG. 6B, the input circuit 11 includes a first input sub-circuit 111, a second input sub-circuit 112 and a third input sub-circuit 113. The first input sub-circuit 111 is coupled to the first signal input terminal putt the second signal input terminal Iput2 and the third input sub-circuit 113. The second input sub-circuit 112 is coupled to the first signal input terminal Iput1, the second signal input terminal Iput2 and the third input sub-circuit 113. The third input sub-circuit 113 is further coupled to the first clock signal terminal CLK1 and the first node N1.

The first input sub-circuit 111 is configured to transmit the second signal to the third input sub-circuit 113 in response to the first signal. The second input sub-circuit 112 is configured to transmit the first signal to the third input sub-circuit 113 in response to the second signal. The third input sub-circuit 113 is configured to transmit the second signal from the first input sub-circuit 111 to the first node N1 in response to the first clock signal, and transmit the first signal from the second input sub-circuit 112 to the first node N1 in response to the first clock signal.

Figure 7:
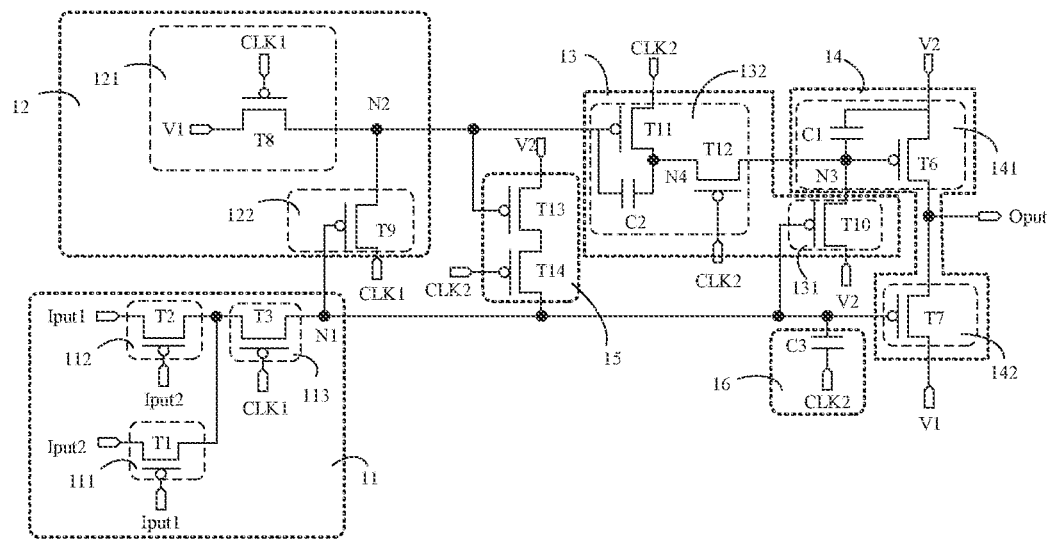
FIG. 7 is a structural diagram of yet another shift register, in accordance with some embodiments.

For example, as shown in FIG. 7, the first input sub-circuit 111 includes a first transistor T1. A control electrode of the first transistor T1 is coupled to the first signal input terminal Iput1, a first electrode of the first transistor T1 is coupled to the second signal input terminal Iput2, and a second electrode of the first transistor T1 is coupled to the third input sub-circuit 113.

For example, as shown in FIG. 7, the second input sub-circuit 112 includes a second transistor T2. A control electrode of the second transistor T2 is coupled to the second signal input terminal Iput2, a first electrode of the second transistor T2 is coupled to the first signal input terminal Iput1, and a second electrode of the second transistor T2 is coupled to the third input sub-circuit 113.

For example, as shown in FIG. 7, the third input sub-circuit 113 includes a third transistor T3. A control electrode of the third transistor T3 is coupled to the first clock signal terminal CLK1, a first electrode of the third transistor T3 is coupled to the first input sub-circuit 111 and the second input sub-circuit 112, and a second electrode of the third transistor T3 is coupled to the first node N1.

In a case where the first input sub-circuit 111 includes the first transistor T1 and the second input sub-circuit 112 includes the second transistor T2, the first electrode of the third transistor T3 is coupled to the second electrode of the first transistor T1 and the second electrode of the second transistor T2.

Figure 8:
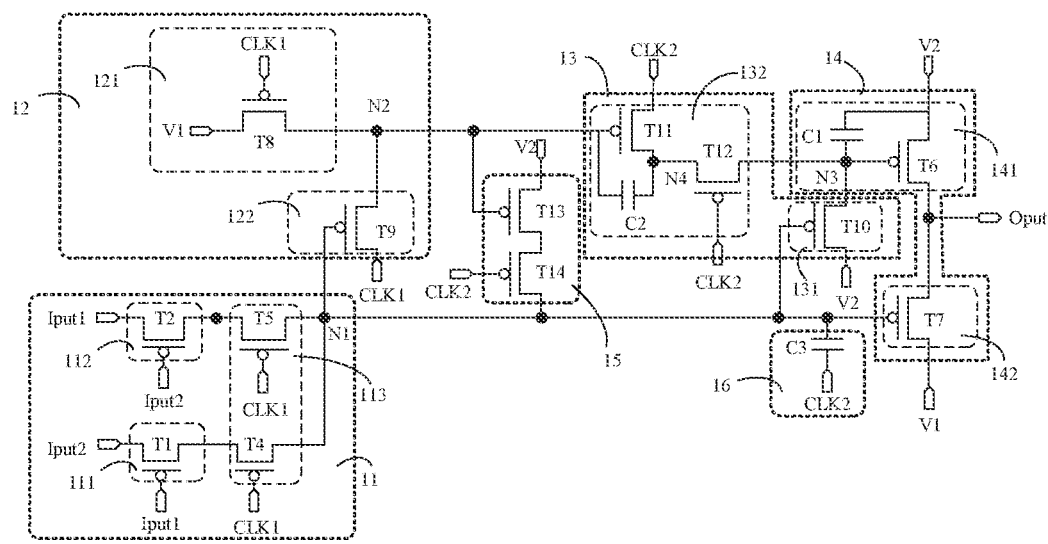
FIG. 8 is a structural diagram of yet another shift register, in accordance with some embodiments.

For example, as shown in FIG. 8, the third input sub-circuit 113 includes a fourth transistor T4 and a fifth transistor T5.

A control electrode of the fourth transistor T4 is coupled to the first clock signal terminal CLK1, a first electrode of the fourth transistor T4 is coupled to the first input sub-circuit 111, and a second electrode of the fourth transistor T4 is coupled to the first node N1.

A control electrode of the fifth transistor T5 is coupled to the first clock signal terminal CLK1, a first electrode of the fifth transistor T5 is coupled to the second input sub-circuit 112, and a second electrode of the fifth transistor T5 is coupled to the first node N1.

In a case where the first input sub-circuit 111 includes the first transistor T1, the first electrode of the fourth transistor T4 is coupled to the second electrode of the first transistor T1. In a case where the second input sub-circuit 112 includes the second transistor T2, the first electrode of the fifth transistor T5 is coupled to the second electrode of the second transistor T2.

In some embodiments, as shown in FIG. 6B, the output circuit 14 includes a first output sub-circuit 141 and a second output sub-circuit 142. The first output sub-circuit 141 is coupled to the third node N3, the second voltage terminal V2 and the signal output terminal Oput. The second output sub-circuit 142 is coupled to the first node N1, the first voltage terminal V1 and the signal output terminal Oput.

The first output sub-circuit 141 is configured to transmit the second voltage to the signal output terminal Oput in response to the voltage of the third node N3. The second output sub-circuit 142 is configured to transmit the first voltage to the signal output terminal Oput in response to the voltage of the first node N1.

For example, as shown in FIGS. 7 and 8, the first output sub-circuit 141 includes a sixth transistor T6 and a first capacitor C1.

A control electrode of the sixth transistor T6 is coupled to the third node N3, a first electrode of the sixth transistor T6 is coupled to the second voltage terminal V2, and a second electrode of the sixth transistor T6 is coupled to the signal output terminal Oput.

A first terminal of the first capacitor C1 is coupled to the third node N3, and a second terminal of the first capacitor C1 is coupled to the second voltage terminal V2.

For example, as shown in FIGS. 7 and 8, the second output sub-circuit 142 includes a seventh transistor T7.

A control electrode of the seventh transistor T7 is coupled to the first node N1, a first electrode of the seventh transistor T7 is coupled to the first voltage terminal V1, and a second electrode of the seventh transistor T7 is coupled to the signal output terminal Oput.

In some embodiments, as shown in FIG. 63, the first control circuit 12 includes a first control sub-circuit 121 and a second control sub-circuit 122. The first control sub-circuit 121 is coupled to the first clock signal terminal CLK1, the first voltage terminal V1 and the second node N2. The second control sub-circuit 122 is coupled to the first node N1, the first clock signal terminal CLK1 and the second node N2.

The first control sub-circuit 121 is configured to transmit the first voltage to the second node N2 in response to the first clock signal. The second control sub-circuit 122 is configured to transmit the first clock signal to the second node N2 in response to the voltage of the first node N1.

For example, as shown in FIGS. 7 and 8, the first control sub-circuit 121 includes an eighth transistor T8. A control electrode of the eighth transistor T8 is coupled to the first clock signal terminal CLK1, a first electrode of the eighth transistor T8 is coupled to the first voltage terminal V1, and a second electrode of the eighth transistor T8 is coupled to the second node N2.

For example, as shown in FIGS. 7 and 8, the second control sub-circuit 122 includes a ninth transistor T9. A control electrode of the ninth transistor T9 is coupled to the first node N1, a first electrode of the ninth transistor T9 is coupled to the first clock signal terminal CLK1, and a second electrode of the ninth transistor T9 is coupled to the second node N2.

In some embodiments, as shown in FIG. 6B, the second control circuit 13 includes a third control sub-circuit 131 and a fourth control sub-circuit 132. The third control sub-circuit 131 is coupled to the first node N1, the third node N3 and the second voltage terminal V2. The fourth control sub-circuit 132 is coupled to the second node N2, the second clock signal terminal CLK2 and the third node N3.

The third control sub-circuit 131 is configured to transmit the second voltage to the third node N3 in response to the voltage of the first node N1.

The fourth control sub-circuit 132 is configured to transmit the second clock signal to the third node N3 in response to the voltage of the second node N2 and the second clock signal.

For example, as shown in FIGS. 7 and 8, the third control sub-circuit 131 includes a tenth transistor T10.

A control electrode of the tenth transistor T10 is coupled to the first node N1, a first electrode of the tenth transistor T10 is coupled to the second voltage terminal V2, and a second electrode of the tenth transistor T10 is coupled to the third node N3.

For example, as shown in FIGS. 7 and 8, the fourth control sub-circuit 132 includes a eleventh transistor T11, a twelfth transistor T12 and a second capacitor C2.

A control electrode of the eleventh transistor T11 is coupled to the second node N2, and a first electrode of the eleventh transistor T11 is coupled to the second clock signal terminal CLK2.

A control electrode of the twelfth transistor T12 is coupled to the second clock signal terminal CLK2, a first electrode of the twelfth transistor T12 is coupled to a second electrode of the eleventh transistor T11, and a second electrode of the twelfth transistor T12 is coupled to the third node N3.

A first terminal of the second capacitor C2 is coupled to the second node N2, and a second terminal of the second capacitor C2 is coupled to the second electrode of the eleventh transistor T11 and the first electrode of the twelfth transistor T12.

As shown in FIGS. 7 and 8, the second electrode of the eleventh transistor T11, the first electrode of the twelfth transistor T12, and the second terminal of the second capacitor C2 are coupled to each other at the fourth node N4.

In some embodiments, as shown in FIGS. 6A and 6B, the shift register SR further includes a third control circuit 15. The third control circuit 15 is coupled to the second node N2, the second voltage terminal V2, the first node N1 and the second clock signal terminal CLK2.

The third control circuit 15 is configured to transmit the second voltage of the second voltage terminal V2 to the first node N1 in response to the voltage of the second node N2 and the second clock signal received at the second clock signal terminal CLK2. In this way, the third control circuit 15 may be able to control the voltage of the first node N1.

For example, as shown in FIGS. 7 and 8, the third control circuit 15 includes a thirteenth transistor T13 and a fourteenth transistor T14.

A control electrode of the thirteenth transistor T13 is coupled to the second node N2, and a first electrode of the thirteenth transistor T13 is coupled to the second voltage terminal V2.

A control electrode of the fourteenth transistor T14 is coupled to the second clock signal terminal CLK2, a first electrode of the fourteenth transistor T14 is coupled to a second electrode of the thirteenth transistor T13, and a second electrode of the fourteenth transistor T14 is coupled to the first node N1.

In some embodiments, as shown in FIGS. 6A and 6B, the shift register SR further includes a fourth control circuit 16. The fourth control circuit 16 is coupled to the first node N1 and the second clock signal terminal CLK2.

The fourth control circuit 16 is configured to control the voltage of the first node N1 according to the second clock signal received at the second clock signal terminal CLK2. In this way, the fourth control circuit 16 may be able to stabilize the voltage of the first node N1 when the voltage of the first node N1 is in a floating state.

For example, as shown in FIGS. 7 and 8, the fourth control sub-circuit 16 includes a third capacitor C3. A first terminal of the third capacitor C3 is coupled to the second clock signal terminal CLK2, and a second terminal of the third capacitor C3 is coupled to the first node N1.

It will be noted that, the transistors used in the shift register SR provided in the embodiments of the present disclosure may be thin film transistors (TFTs), field effect transistors (FETs) or other switching devices with the same characteristics, which is not limited in the embodiments of the present disclosure.

In some embodiments, a control electrode of each transistor used in the shift register SR is a gate of the transistor, a first electrode of the transistor is one of a source and a drain of the transistor, and a second electrode of the transistor is another of the source and the drain of the transistor. Since the source and the drain of the transistor may be symmetrical in structure, there may be no difference in structure between the source and the drain of the transistor. That is, the first electrode and the second electrode of the transistor in the embodiments of the present disclosure may be the same in structure. For example, in a case where the transistor is a P-type transistor, the first electrode of the transistor is the source, and the second electrode thereof is the drain. For example, in a case where the transistor is an N-type transistor, the first electrode of the transistor is the drain, and the second electrode thereof is the source.

In the circuit provided in the embodiments of the present disclosure, the first node N1, the second node N2, the third node N3 and the fourth node N4 do not represent actual components, but rather represent junctions of related electrical connections in a circuit diagram. That is, these nodes are nodes equivalent to the junctions of the related electrical connections in the circuit diagram.

In the shift register circuit SR provided in the embodiments of the present disclosure, specific implementation manners of circuits and sub-circuits are not limited to the manners described above, and may be any implementation manners, such as a conventional connection manner well known to a person skilled in the art, as long as corresponding functions may be achieved. The above examples do not limit the protection scope of the present disclosure. In practical applications, a person skilled in the art may choose to use or not to use one or more of the above circuits according to situations. Various combinations and variations based on the above circuits do not depart from the principle of the present disclosure, and details are not repeated herein.

Hereinafter, by taking an example in which the above transistors are all P-type transistors, operations of transistors in the shift register SR in different periods of the period of a frame are described in detail.

It will be noted that, the shift register may have m operating periods (S1 to Sm) in the period of one frame. Here, m is an integer greater than or equal to 1; and the actual value of m may be set according to actual conditions, which is not limited in the present disclosure. For example, m may be set to 4 or 8. For example, in a case where the refresh frequency of the display panel (screen) is 60 Hz, m may be set to 4. In this case, referring to FIG. 9, the first signal ESTV1 may have 4 high levels (i.e., 4 pulses) in the period of one frame, and the second signal ESTV2 may have 4 high levels (i.e., 4 pulses) in the period of one frame.

Figure 9:
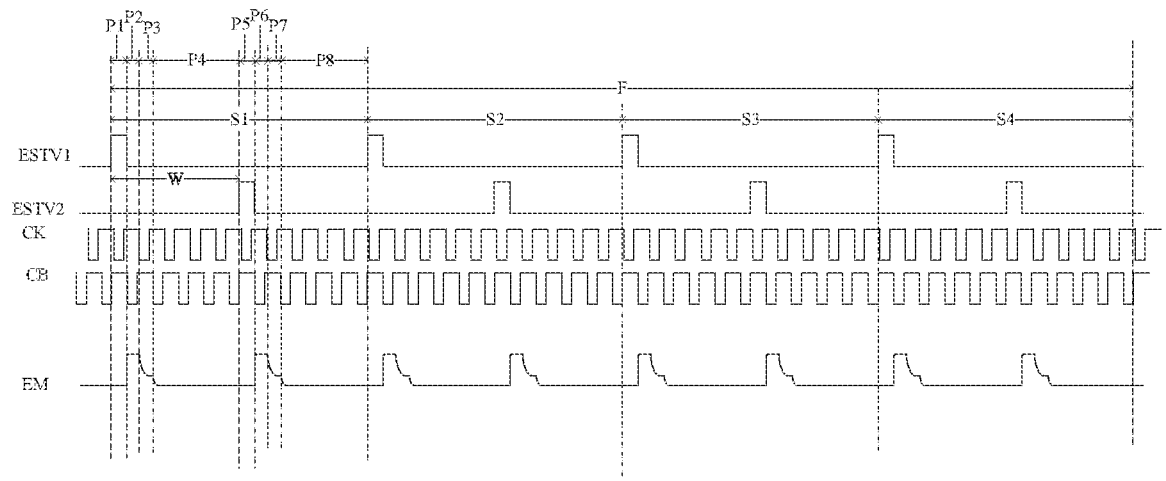
FIG. 9 is a timing diagram of signals for driving a shift register, in accordance with some embodiments.

As shown in FIG. 9, the shift register has 4 operating periods (S1 to S4) in the period of one frame (F). Operations of circuits and sub-circuits in the shift register in each operating period are similar; therefore, only the first operating period (S1) is described below. As for the rest of the operating periods, reference may be made to the description of the first operating period, and details will not be repeated.

As shown in FIG. 9, in a first period (P1) of the first operating period (S1), the input circuit 11 transmits the first signal ESTV1 received at the first signal input terminal Iput1 to the first node N1 in response to the first clock signal CK received at the first clock signal terminal CLK1 and the second signal ESTV2 received at the second signal input terminal Iput2.

For example, referring to FIG. 6B, the second input sub-circuit 112 transmits the first signal ESTV1 to the third input sub-circuit 113 in response to the second signal ESTV2. The third input sub-circuit 113 transmits the signal from the second input sub-circuit 112 (i.e., the first signal ESTV1) to the first node N1 in response to the first clock signal CK.

For example, as shown in FIG. 7, the third transistor T3 is turned on in response to the low-level first clock signal CK received at the first clock signal terminal CLK1. The second transistor T2 is turned on in response to the low-level second signal ESTV2. In addition, since the first signal ESTV1 is at a high level, the first transistor T1 is turned off; therefore, the first transistor T1 will not form a conductive path with the third transistor T3, and will not transmit the low-level second signal ESTV2 to the first node N1 In this case, the second transistor T2 and the third transistor T3 form a conductive path to transmit the high-level first signal ESTV1 to the first node N1. At this time, the voltage of the first node N1 is at a high level.

For example, as shown in FIG. 8, the fourth transistor T4 and the fifth transistor T5 are both turned on in response to the low-level first clock signal CK. The second transistor T2 is turned on in response to the low-level second signal ESTV2. In addition, since the first signal ESTV1 is at a high level, the first transistor T1 is turned off; therefore, the first transistor T1 will not form a conductive path with the fourth transistor T4, and will not transmit the low-level second signal ESTV2 to the first node N1. In this case, the second transistor T2 and the fifth transistor T5 form a conductive path to transmit the high-level first signal received at the first signal input terminal Iput1 to the first node N1. At this time, the voltage of the first node N1 is at a high level.

The first control circuit 12 transmits the first voltage of the first voltage terminal V1 to the second node N2 in response to the first clock signal CK. For example, referring to FIG. 6B, the first control sub-circuit 121 transmits the first voltage to the second node N2 in response to the first clock signal OK. For example, as shown in FIG. 7, the eighth transistor T8 is turned on in response to the low-level first clock signal CK, and transmits the low-level first voltage VGL to the second node N2. At this time, the voltage of the second node N2 is at a low level. In addition, the ninth transistor T9 is turned off in response to the high-level voltage of the first node N1, and will not transmit the first clock signal CK to the second node N2.

In addition, as for the third control sub-circuit 131 in the second control circuit 13, the tenth transistor T10 therein is turned off in response to the high-level voltage of the first node N1, and will not transmit the second voltage to the third node N3. As for the fourth control sub-circuit 132, the eleventh transistor T11 therein is turned on in response to the low-level voltage of the second node N2, and transmits the high-level second clock signal CB to the first electrode of the twelfth transistor T12 and the second terminal of the second capacitor C2, that is, to the fourth node N4, so that the voltage of the fourth node N4 is at a high level. The twelfth transistor T12 is turned off in response to the high-level second clock signal CB, and will not transmit a high-level voltage to the third node N3. In addition, the thirteenth transistor T13 in the third control circuit 15 is turned on in response to the low-level voltage of the second node N2, and the fourteenth transistor T14 is turned off in response to the high-level second clock signal CB. Therefore, the high-level second voltage VGH of the second voltage terminal V2 will not be transmitted to the first node N1.

In the output circuit 14, the seventh transistor T7 in the second output sub-circuit 142 is turned off in response to the high-level voltage of the first node N1, and will not transmit the low-level first voltage of the first voltage terminal V1 to the signal output terminal Oput. At this time, the third node N3 is in a floating state, and the first terminal of the first capacitor C1 in the first output sub-circuit 141 receives the high-level second voltage of the second voltage terminal V2. Due to the storage function of the first capacitor C1, the voltage of the third node N3 may be controlled to be at a high level. The sixth transistor T6 is turned off in response to the high-level voltage of the third node N3, and will not transmit the second voltage of the second voltage terminal V2 to the signal output terminal Oput. In this case, since the seventh transistor T7 and the sixth transistor T6 are both in a turned-off state, a signal (i.e., a light-emitting control signal) output by the signal output terminal Oput of the shift register SR remains at a low level as before.

In a second period (P2) of the first operating period (S1) as shown in FIG. 9, for example, as shown in FIG. 7, the second transistor T2 in the second input sub-circuit 112 of the input circuit 11 is turned on in response to the low-level second signal ESTV2 received at the second signal input terminal Iput2, and the first transistor T1 in the first input sub-circuit 111 is turned on in response to the low-level first signal ESTV1 received at the first signal input terminal Iput1 Since the third transistor T3 in the third input sub-circuit 113 of the input circuit 11 is turned off in response to the high-level first clock signal CK received at the first clock signal terminal CLK1, neither the second transistor T2 nor the first transistor T1 will form a conductive path with the third transistor T3. Therefore, the input circuit 11 will not transmit a signal to the first node N1. At this time, the voltage of the first node N1 is at the high level of the previous period.

For example, as shown in FIG. 8, the fourth transistor T4 and the fifth transistor T5 in the third input sub-circuit 113 are both turned off in response to the high-level first clock signal CK received at the first clock signal terminal CLK1. The first transistor T1 in the first input sub-circuit 111 is turned on in response to the low-level first signal ESTV1 received at the first signal input terminal Iput1, and the second transistor T2 in the second input sub-circuit 112 is turned on in response to the low-level second signal ESTV2 received at the second signal input terminal Iput2. In this case, the fourth transistor T4 and the first transistor T1 will not form a conductive path, and the second transistor T2 and the fifth transistor T5 will not form a conductive path. Therefore, neither the second signal ESTV2 nor the first signal ESTV1 will be transmitted to the first node N1. At this time, the voltage of the first node N1 is at the high level of the previous period.

For example, as shown in FIG. 7, the eighth transistor T8 in the first control sub-circuit 121 of the first control circuit 12 is turned off in response to the high-level first clock signal CK, and will not transmit the low-level first voltage VGL to the second node N2. The ninth transistor T9 in the second control sub-circuit 122 is turned off in response to the high-level voltage of the first node N1 and will not transmit the first clock signal CK to the second node N2.

Due to the storage effect of the second capacitor C2 in the fourth control sub-circuit 132 of the second control circuit 13, the voltage of the second node N2 remains at the low level of the previous period.

In this case, the eleventh transistor T11 in the fourth control sub-circuit 132 of the second control circuit 13 is turned on in response to the low-level voltage of the second node N2, and transmits the low-level second clock signal CB to the fourth node N4. The twelfth transistor T12 is turned on in response to the low-level second clock signal CB. The second control circuit 13 transmits the low-level second clock signal CB to the third node N3. At this time, the voltage of the third node N3 is at a low level.

In this case, the first output sub-circuit 141 in the output circuit 14 transmits the second voltage VGH of the second voltage terminal V2 to the signal output terminal Oput in response to the voltage of the third node N3. For example, the sixth transistor T6 in the first output sub-circuit 141 is turned on in response to the low-level voltage of the third node N3, and transmits the high-level second voltage VGH of the second voltage terminal V2 to the signal output terminal Oput, so that the signal output by the signal output terminal Oput is at a high level. That is, the light-emitting control signal EM is at a high level.

Moreover, due to the bootstrap effect of the second capacitor C2, the eleventh transistor T11 may be fully turned on, thereby reducing a signal loss caused by a threshold voltage of the eleventh transistor T11, and improving the stability and reliability of the signal output by the signal output terminal Oput.

In addition, the thirteenth transistor T13 in the third control circuit 15 is turned on in response to the low-level voltage of the second node N2, the fourteenth transistor T14 in the third control circuit 15 is turned on in response to the low-level second clock signal CB, and the third control circuit 15 transmits the second voltage to the first node N1, so that the voltage of the first node N1 is at a high level. Since the voltage of the first node N1 is at a high level, the seventh transistor T7 in the second output sub-circuit 142 is turned off, and the tenth transistor T10 in the third control sub-circuit 131 is turned off.

In this case, referring to FIG. 3, under the control of the high-level light-emitting control signal EM, the transistor M5 and the transistor M6 in the pixel circuit 20 are turned off. The light-emitting device L does not emit light, and a black frame insertion is performed on the display panel (i.e., the screen).

In a third period (P3) of the first operating period (S1) as shown in FIG. 9, the input circuit 11 transmits the first signal ESTV1 received at the first signal input terminal Iput1 to the first node N1 in response to the first clock signal OK received at the first clock signal terminal CLK1 and the second signal ESTV2 received at the second signal input terminal Iput2, and transmits the second signal ESTV2 received at the second signal input terminal Iput2 to the first node N1 in response to the first clock signal received at the first clock signal terminal CLK1 and the first signal ESTV1 received at the first signal input terminal Iput1.

For example, as shown in FIG. 7, the third transistor T3 in the third input sub-circuit 113 of the input circuit 11 is turned on in response to the low-level first clock signal OK received at the first clock signal terminal CLK1, the second transistor T2 in the second input sub-circuit 112 is turned on in response to the low-level second signal ESTV2 received at the second signal input terminal Iput2, and the first transistor T1 in the first input sub-circuit 111 is turned on in response to the low-level first signal ESTV1 received at the first signal input terminal Iput1. Therefore, the low-level second signal ESTV2 is transmitted to the first node N1 through the first transistor T1 and the third transistor T3, and the low-level first signal ESTV1 is transmitted to the first node N1 through the second transistor T2 and the third transistor T3. At this time, the voltage of the first node N1 is at a low level.

For example, as shown in FIG. 8, the fourth transistor T4 and the fifth transistor T5 in the third input sub-circuit 113 are turned on in response to the low-level first clock signal CK received at the first clock signal terminal CLK1. The first transistor T1 in the first input sub-circuit 111 is turned on in response to the low-level first signal ESTV1 received at the first signal input terminal Iput1 In this case, the low-level second signal ESTV2 received at the second signal input terminal Iput2 is transmitted to the first node N1 through the first transistor T1 and the fourth transistor T4. In addition, the second transistor T2 in the second input sub-circuit 112 is turned on in response to the low-level second signal ESTV2 received at the second signal input terminal Iput2, and transmits the low-level first signal ESTV1 to the first node N1. At this time, the voltage of the first node N1 is at a low level.

The first control circuit 12 transmits the first clock signal CK received at the first clock signal terminal CLK1 to the second node N2 in response to the voltage of the first node N1, and transmits the first voltage of the first voltage terminal V1 to the second node N2 in response to the first clock signal CK. For example, the first control sub-circuit 121 transmits the first voltage of the first voltage terminal V1 to the second node N2 in response to the first clock signal CK; and the second control sub-circuit 122 transmits the first clock signal CK to the second node N2 in response to the voltage of the first node N1.

For example, the eighth transistor T8 in the first control sub-circuit 121 transmits the first voltage of the first voltage terminal V1 to the second node N2 in response to the low-level first clock signal CK. The ninth transistor T9 in the second control sub-circuit 122 transmits the low-level first clock signal CK to the second node N2 in response to the low-level voltage of the first node N1. At this time, the voltage of the second node N2 is at a low level.

The third control sub-circuit 131 in the second control circuit 13 transmits the second voltage of the second voltage terminal V2 to the third node N3 in response to the voltage of the first node N1. For example, the tenth transistor T10 is turned on in response to the low-level voltage of the first node N1, and transmits the high-level second voltage of the second voltage terminal V2 to the third node N3. At this time, the voltage of the third node N3 is at a high level. In addition, the eleventh transistor T11 in the fourth control sub-circuit 132 of the second control circuit 13 transmits the high-level second clock signal CB to the fourth node N4 in response to the voltage of the second node N2. The twelfth transistor T12 is turned off in response to the high-level second clock signal CB, and will not transmit the high-level second clock signal CB to the third node N3. Therefore, the voltage of the third node N3 is at a high level.

The sixth transistor T6 in the first output sub-circuit 141 in the output circuit 14 is turned off in response to the high-level voltage of the third node N3, and will not transmit the second voltage of the second voltage terminal V2 to the signal output terminal Oput. The second output sub-circuit 142 transmits the first voltage of the first voltage terminal V1 to the signal output terminal Oput in response to the voltage of the first node N1. For example, the seventh transistor T7 in the second output sub-circuit 142 is turned on in response to the low-level voltage of the first node N1, and transmits the first voltage to the signal output terminal Oput. In this way, the signal output by the signal output terminal Oput is at a low level. That is, the light-emitting control signal EM is at a low level.

In this case, referring to FIG. 3, the transistor M5 and the transistor M6 in the pixel circuit 20 are turned on in response to the low-level light-emitting control signal EM, and the pixel circuit 20 may enter the third period (3) shown in FIG. 4. The pixel circuit 20 transmits a driving signal to the light-emitting device L to drive the light-emitting device L to emit light.

In addition, as shown in FIG. 7, the thirteenth transistor T13 in the third control circuit 15 is turned on in response to the low-level voltage of the second node N2, and the fourteenth transistor T14 is turned off in response to the high-level second clock signal CB received at the second clock signal terminal CLK2. In this way, the second voltage of the second voltage terminal V2 will not be transmitted to the first node N1 by the third control circuit 15, and the voltage of the first node N1 remains at a low level.

It will be noted that, in the third period (P3), due to an influence of threshold voltages of transistors in the input circuit 11 (e.g., the third input sub-circuit 113 and the second input sub-circuit 112) and the output circuit 14 (e.g., the second output sub-circuit 142), the voltage of the low-level signal output by the signal output terminal Oput is different from the voltage of the first voltage terminal V1. For example, the absolute value of the voltage of the first voltage terminal V1 (e.g., −7 V) is higher than the absolute value of the voltage of the low-level signal output by the signal output terminal Oput (e.g., −2 V).

In a fourth period (P4) of the first operating period (S1) as shown in FIG. 9, in some moments of the period, the second transistor T2 is turned on in response to the low-level second signal ESTV2, and the first transistor T1 is turned on in response to the low-level first signal ESTV1. The third transistor T3 is turned off in response to the high-level first clock signal CK. Therefore, neither the second transistor T2 nor the first transistor T1 will form a conductive path with the third transistor T3, and the first signal ESTV1 and the second signal ESTV2 will not be transmitted to the first node N1 For another example, as shown in FIG. 8, the fourth transistor T4 and the fifth transistor T5 are both turned off in response to the high-level first clock signal CK. In this case, the second signal ESTV2 will not be transmitted to the first node N1 through the first transistor T1 and the fourth transistor T4, and the first signal ESTV1 will not be transmitted to the first node N1 through the second transistor T2 and the fifth transistor T5. At this time, the first node N1 is in a floating state. The fourth control circuit 16 controls the voltage of the first node N1 according to the second clock signal CB received at the second clock signal terminal CLK2. For example, as shown in FIG. 7, due to the storage effect of the third capacitor C3 in the fourth control circuit 16, the third capacitor may be able to control the voltage of the first node N1 to remain at the low level of the previous period according to the low-level second clock signal CB received at the second clock signal terminal CLK2.

In this case, the tenth transistor T10 is turned on in response to the low-level voltage of the first node N1, and transmits the high-level second voltage of the second voltage terminal V2 to the third node N3. At this time, the voltage of the third node N3 is at a high level. In this case, the sixth transistor T6 is turned off in response to the high-level voltage of the third node N3. The seventh transistor T7 is turned on in response to the low-level voltage of the first node N1, and transmits the low-level first voltage of the first voltage terminal V1 to the signal output terminal Oput. In this case, the signal output terminal Oput outputs a low-level signal. In addition, a voltage of the low-level signal output by the signal output terminal Oput in the fourth period (P4) is lower than the voltage of the low-level signal output by the signal output terminal Oput in the third period (P3). For example, the voltage of the low-level signal output by the signal output terminal Oput in the fourth period (P4) is equal to the first voltage (e.g., −7 V).

In this case, referring to FIG. 3, the transistor M5 and the transistor M6 in the pixel circuit 20 are turned on, and the pixel circuit 20 drives the light-emitting device L to emit light.

In addition, the ninth transistor T9 is turned on in response to the low-level voltage of the first node N1, and transmits the high-level first clock signal CK to the second node N2, so that the voltage of the second node N2 is at a high level. The eighth transistor T8 is turned off in response to the high-level first clock signal CK, and will not transmit the low-level first voltage to the second node N2. At this time, the voltage of the second node N2 is at a high level.

The thirteenth transistor T13 is turned off in response to the high-level voltage of the second node N2, and the fourteenth transistor T14 is turned on in response to the low-level second clock signal CB. In this way, the second voltage of the second voltage terminal V2 will not be transmitted to the first node N1, and the voltage of the first node N1 remains at a low level.

The eleventh transistor T11 is turned off in response to the high-level voltage of the second node N2, and the twelfth transistor T12 is turned on in response to the low-level second clock signal CB. In this case, the second clock signal CB will not be transmitted to the third node N3.

In some other moments of the fourth period (P4), the second transistor T2 is turned on in response to the low-level second signal ESTV2, and the first transistor T1 is turned on in response to the low-level first signal ESTV1. The third transistor T3 shown in FIG. 7 is turned on in response to the low-level first clock signal CK received at the first clock signal terminal CLK1; or, the fourth transistor T4 and the fifth transistor T5 shown in FIG. 8 are both turned on in response to the low-level first clock signal CK. In this case, the first signal ESTV1 and the second signal ESTV2 are transmitted to the first node N1 The voltage of the first node N1 is at a low level.

In this case, the tenth transistor T10 is turned on in response to the low-level voltage of the first node N1, and transmits the high-level second voltage of the second voltage terminal V2 to the third node N3. At this time, the voltage of the third node N3 is at a high level. In this case, the sixth transistor T6 is turned off in response to the high-level voltage of the third node N3. The seventh transistor T7 is turned on in response to the low-level voltage of the first node N1, and transmits the low-level first voltage of the first voltage terminal V1 to the signal output terminal Oput. At this time, the signal output terminal Oput outputs a low level signal. In addition, a voltage of the low-level signal output by the signal output terminal Oput in the fourth period (P4) is lower than the voltage of the low-level signal output by the signal output terminal Oput in the third period (P3). For example, the voltage of the low-level signal output by the signal output terminal Oput in the fourth period (P4) is equal to the first voltage (e.g., −7 V).

In this case, referring to FIG. 3, the transistor M5 and the transistor M6 in the pixel circuit 20 are turned on, and the pixel circuit 20 drives the light-emitting device L to emit light.

In addition, the ninth transistor T9 is turned on in response to the low-level voltage of the first node N1, and transmits the low-level first clock signal CK to the second node N2, so that the voltage of the second node N2 is at a low level. The eighth transistor T8 is turned on in response to the low-level first clock signal CK, and transmits the low-level first voltage to the second node N2. At this time, the voltage of the second node N2 is at a low level.

The thirteenth transistor T13 is turned on in response to the low-level voltage of the second node N2, and the fourteenth transistor T14 is turned off in response to the high-level second clock signal CB. In this case, the second voltage of the second voltage terminal V2 will not be transmitted to the first node N1, and the voltage of the first node N1 remains at a low level.

The eleventh transistor T11 is turned on in response to the low-level voltage of the second node N2, and the twelfth transistor T12 is turned off in response to the high-level second clock signal CB. In this case, the second clock signal CB will not be transmitted to the third node N3.

After the preset time period, in a fifth period (P5) of the first operating period (S1) as shown in FIG. 9, the input circuit 11 transmits the second signal ESTV2 received at the second signal input terminal Iput2 to the first node N1 in response to the first clock signal CK received at the first clock signal terminal CLK1 and the first signal ESTV1 received at the first signal input terminal Iput1. For example, the first input sub-circuit 111 transmits the second signal ESTV2 received at the second signal input terminal Iput2 to the third input sub-circuit 113 in response to the first signal ESTV1 received at the first signal input terminal Iput1. The third input sub-circuit 113 transmits a signal from the first input sub-circuit 111 to the first node N1 in response to the first clock signal CK received at the first clock signal terminal CLK1.

For example, as shown in FIG. 7, the third transistor T3 is turned on in response to the low-level first clock signal CK. The first transistor T1 is turned on in response to the low-level first signal ESTV1. In addition, since the second signal ESTV2 received at the second signal input terminal Iput2 is at a high level, the second transistor T2 is turned off. Therefore, the second transistor T2 will not form a conductive path with the third transistor T3, and will not transmit the low-level first signal ESTV1 to the first node N1 In this case, the first transistor T1 forms a conductive path with the third transistor T3, and transmits the high-level second signal ESTV2 received at the second signal input terminal Iput2 to the first node N1. At this time, the voltage of the first node N1 is at a high level.

For example, as shown in FIG. 8, the fourth transistor T4 and the fifth transistor T5 are turned on in response to the low-level first clock signal CK received at the first clock signal terminal CLK1. The first transistor T1 is turned on in response to the low-level first signal ESTV1. In addition, since the second signal ESTV2 received at the second signal input terminal Iput2 is at a high level, the second transistor T2 is turned off; therefore, the second transistor T2 will not form a conductive path with the fifth transistor T5, and will not transmit the low-level first signal ESTV1 to the first node N1. In this case, the first transistor T1 forms a conductive path with the fourth transistor T4, and transmits the high-level second signal ESTV2 received at the second signal input terminal Iput2 to the first node N1. At this time, the voltage of the first node N1 is at a high level.

It will be noted that, operating processes of other circuits except for the input circuit 11 in the shift register SR are similar to the operating processes thereof in the first period (P1) as described above. Regarding the operating processes of these circuits, reference can be made to the above description of the first period (P1), and details will not repeated here. In this case, the signal output by the signal output terminal Oput in the shift register SR is at a low level.

In a sixth period (P6) of the first operating period (S1) as shown in FIG. 9, the operating process of each circuit in the shift register SR is similar to the operating process thereof in the second period (P2) as described above. Regarding the operating processes of the circuits, reference can be made to the above description of the second period (P2), and details will not be repeated here. In this case, the signal output by the signal output terminal Oput is at a high level. In this situation, referring to FIG. 3, the transistor M5 and the transistor M6 in the pixel circuit 20 are turned off, and the light-emitting device L does not emit light; that is, a black frame insertion is performed on the display panel.

In a seventh period (P7) of the first operating period (S1) as shown in FIG. 9, the operating process of each circuit in the shift register SR is similar to the operating process thereof in the third period (P3) as described above. Regarding the operating processes of the circuits, reference can be made to the above description of the third period (P3), and details will not be repeated here. In this case, the signal output by the signal output terminal Oput is at a low level. In addition, due to the influence of the threshold voltages of transistors in the input circuit 11 (e.g., the third input sub-circuit 113 and the first input sub-circuit 111) and the output circuit 14 (e.g., the second output sub-circuit 142), the voltage of the low-level signal output by the signal output terminal Oput is different from the first voltage of the first voltage terminal V1. In this way, referring to FIG. 3, the transistor M5 and the transistor M6 in the pixel circuit 20 are turned on, and the pixel circuit 20 enters the third period (3) shown in FIG. 4, so as to drive the light-emitting device L to emit light.

In an eighth period (P8) of the first operating period (S1) as shown in FIG. 9, the operating process of each circuit in the shift register SR is similar to the operating process thereof in the fourth period (P4) as described above. Regarding the operating processes of the circuits, reference can be made to the above description of the fourth period (P4), and details will not be repeated here. In this case, the signal output terminal Oput still outputs a low-level signal, and the voltage of the low-level signal output by the signal output terminal Oput in the eighth period (P8) is lower than the voltage of the low-level signal output by the signal output terminal Oput in the seventh period (P7). In this case, referring to FIG. 3, the transistor M5 and the transistor M6 in the pixel circuit 20 are turned on, and the pixel circuit 20 drives the light-emitting device L to emit light.

On this basis, compared with a case where the input circuit in the shift register receives one input signal (e.g., the first signal ESTV1), the shift register outputs the high-level signal only once in one operating period, and outputs the high-level signal four times in four operating periods of the period of one frame, so that four black frame insertions are performed on the screen, the input circuit in the shift register provided in the embodiments of the present disclosure receives two signals (e.g., the first signal ESTV1 and the second signal ESTV2), and the shift register outputs the high-level signal twice in one operating period, so that two black frame insertions are performed on the screen. In this way, the shift register may output the high-level signal eight times in the four operating periods of the period of one frame, so that eight black frame insertions are performed on the screen. Therefore, the shift register provided in the embodiments of the disclosure may output signals with multiplied frequency in one operating period, thereby realizing a frequency multiplication function. As a result, the number of black frame insertions performed on the screen may be increased, thereby improving the refresh frequency of the screen.

For example, for a screen driven at 60 Hz in the period of one frame, the number of black frame insertions performed on the display apparatus in the period of one frame is four, and the refresh frequency of the screen is 240 Hz (i.e., 60 Hz by 4), which makes it difficult for the display apparatus to meet requirements of such application scenarios as scanning codes or taking pictures. However, in the embodiments of the disclosure, the number of black frame insertions performed on the display apparatus in the period of one frame is increased to eight, the refresh frequency of the screen is 480 Hz (i.e., 60 Hz by 8), so the refresh frequency of the screen is improved. In addition, in a case where the IC in the display apparatus supports up to 16 black frame insertions, for a screen driven at 60 Hz in the period of one frame, the frequency of the screen after frequency multiplication is 1920 Hz (i.e., 60 Hz by 16 by 2), which enables the display apparatus to meet the requirements of such application scenarios as scanning codes or taking pictures.

In some embodiments, the signal output by the shift register SR may not be multiplied. For example, in an operating period, the shift register SR outputs a high-level signal. For example, referring to FIGS. 7 and 8, the input circuit 11 transmits the first signal received at the first signal input terminal Iput1 to the first node N1 in response to the first clock signal received at the first clock signal terminal CLK1, and transmits the second signal received at the second signal input terminal Iput2 to the first node N1 in response to the first clock signal received at the first clock signal terminal CLK1 and the first signal received at the first signal input terminal Iput1.

Herein, the second signal is a direct current signal. For example, the second signal is a low-level direct current signal. For example, a voltage of the second signal is equal to the first voltage of the first voltage terminal V1. For example, the voltage of the second signal is a direct current low voltage. For example, the second signal input terminal Iput2 and the first voltage terminal V1 are the same signal terminal.

Figure 10:
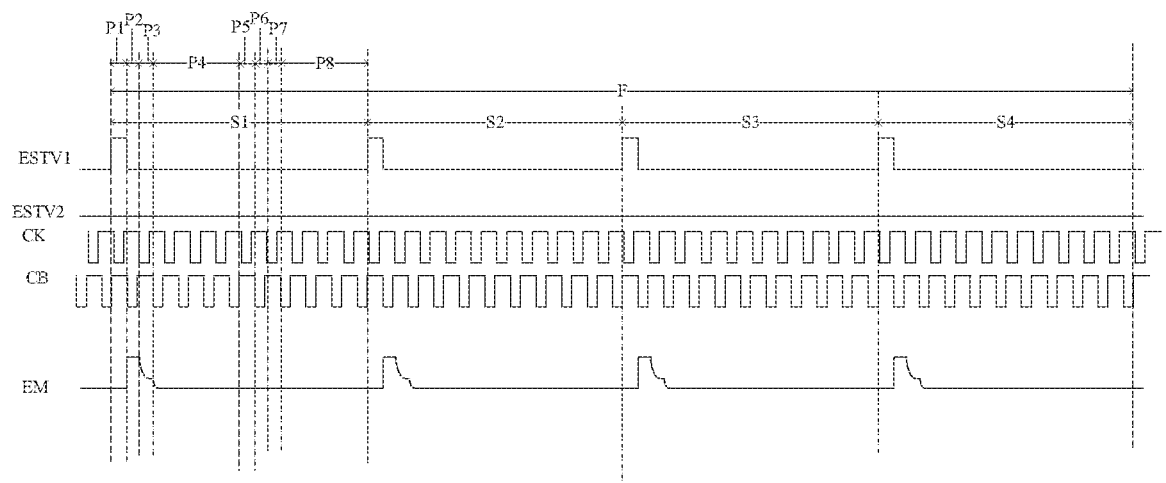
FIG. 10 is another timing diagram of signals for driving a shift register, in accordance with some embodiments.

For example, in the period of one frame (F) as shown in FIG. 10, referring to FIGS. 7 and 8, the second transistor T2 remains at a turned-on state in response to the low-level second signal. In this case, for example, referring to FIG. 7, the first electrode of the third transistor T3 is coupled to the first signal input terminal Iput1. In this way, when the third transistor T3 is turned on in response to the first clock signal, the third transistor T3 transmits the first signal to the first node N1. For example, referring to FIG. 8, the first electrode of the fifth transistor T5 is coupled to the first signal input terminal Iput1. In this way, when the fifth transistor T5 is turned on in response to the first clock signal, the fifth transistor T5 transmits the first signal to the first node N1.

In the first period (P1) of the first operating period (S1) as shown in FIG. 10, referring to FIG. 7, the third transistor T3 and the second transistor T2 are turned on, the first transistor T1 is turned off, and the input circuit 11 transmits a high-level first signal ESTV1 to the first node N1, so that the voltage of the first node N1 is at a high level Referring to FIG. 8, the fourth transistor T4, the fifth transistor T5, and the second transistor T2 are turned on, and the first transistor T1 is turned off; therefore, the high-level first signal ESTV1 is transmitted to the first node N1, so that the voltage of the first node N1 is at a high level.

As for the operating processes of other circuits except for the input circuit 11 in the shift register SR, reference may be made to the operating process of the shift register SR in the first period (P1) of the first operating period (S1) as shown in FIG. 9, and details are not repeated here. In this case, the signal output by the signal output terminal Oput is at a low level.

In the second period (P2) of the first operating period (S1) as shown in FIG. 10, referring to FIG. 7, the first transistor T1 and the second transistor T2 are turned on, and the third transistor T3 is turned off; therefore, the high-level first signal ESTV1 and the second signal ESTV2 will not be transmitted to the first node N1, and the voltage of the first node N1 is at the high level of the previous period. Referring to FIG. 8, the fourth transistor T4 and the fifth transistor T5 are turned off, and the first transistor T1 and the second transistor T2 are turned on; therefore, the voltage of the first node N1 is at the high level of the previous period.

As for the operating processes of other circuits except for the input circuit 11 in the shift register SR, reference may be made to the operating process of the shift register SR in the second period (P2) of the first operating period (S1) as shown in FIG. 9, and details will not be repeated here. In this case, the signal output by the signal output terminal Oput is at a high level. During this period, a black frame insertion is performed on the screen.

In the third period (P3) and the fourth period (P4) of the first operating period (S1) as shown in FIG. 10, the operating processes of the circuits in the shift register SR are the same as the operating processes thereof in the shift register SR in the third period (P3) and the fourth period (P4) of the first operating period (S1) as shown in FIG. 9, and details are not repeated here.

In the fifth period (P5) of the first operating period (S1) as shown in FIG. 10, the operating processes of the circuits in the shift register SR are the same as the operating processes thereof in the shift register SR in the third period (P3) of the first operating period (S1) as shown in FIG. 9, and details are not repeated here. In this case, the signal output by the signal output terminal Oput is a low-level signal. In the sixth period (P6) of the first operating period (S1) as shown in FIG. 10, the operating processes of the circuits in the shift register SR are the same as the operating processes thereof in the shift register SR in the fourth period (P4) of the first operating period (S1) as shown in FIG. 9, and details are not repeated here. In this case, the signal output by the signal output terminal Oput is a low-level signal. In the seventh period (P7) and the eighth period (P8) of the first operating period (S1) as shown in FIG. 10, the operating processes of the circuits in the shift register SR are the same as the operating processes thereof in the shift register SR in the seventh period (P7) and the eighth period (P8) of the first operating period (S1) as shown in FIG. 9, and details are not repeated here.

In this case, in one operating period, the shift register outputs the high-level signal once, and outputs the high-level signal four times in the four operating periods in the period one frame, so that four black frame insertions are performed on the screen, and the signal output by the shift register may not be multiplied. Therefore, the shift register provided in the embodiments of the present disclosure may not be multiplied, so that the screen may be able to realize a small number of black frame insertions and a large number of black frame insertions. Therefore, the shift register may be able to adjust the refreshing frequency of the screen in different application scenarios. For example, the frequency of the signal output by the shift register may not be multiplied in a normal display state, and may be multiplied in a code scanning state, so as to meet the different requirements of the display apparatus and reduce power consumption.

It will be noted that the duty cycle of the first signal and the second signal can be adjusted according to actual conditions, which is not limited here. For example, referring to FIG. 9, a duration of a pulse (i.e., a high level) of the first signal ESTV1 and a duration of a pulse of the second signal ESTV2 may be prolonged. For example, referring to FIG. 9, in the first operating period, the first signal ESTV1 may be kept at a high level from the first period (P1) to the third period (P3), and the second signal ESTV2 may be kept at a high level from the fifth period (P5) to the seventh period (P7). Correspondingly, a duration of a high level of the light-emitting control signal EM is the same as the duration of the high level of the first signal ESTV1. That is, a duration of each black frame insertion is prolonged.

The embodiments of the present disclosure provide a light-emitting control driving circuit. For example, the light-emitting control driving circuit is configured to provide light-emitting control signals to pixel circuits.

For example, as shown in FIGS. 1A and 1B, the display apparatus 200 includes the light-emitting control driving circuit 10. The light-emitting control driving circuit 10 may be disposed on a base substrate of the display panel 100. As shown in FIGS. 1A and 1B, the display panel 100 further includes a plurality of light-emitting signal lines (EL(1), EL(2), EL(3) . . . ), and one shift register is coupled to one light-emitting signal line. The light-emitting signal line is configured to transmit light-emitting control signal. For example, the plurality of light-emitting signal lines extend in the X direction shown in FIGS. 1A and 1B. As shown in FIGS. 1A and 1B, the light-emitting control driving circuit 10 includes a plurality of shift registers (R(1), R(2), R(3) . . . ), and the plurality of shift registers are cascaded in sequence. A first-stage shift register R(1) of the plurality of shift registers is the shift register SR described in any of the above embodiments.

For example, the plurality of sub-pixels are divided into n rows of sub-pixels. In a case where one light-emitting signal line is coupled to one row of sub-pixels (referring to FIG. 1A), an i-th row of sub-pixels is coupled to an i-th-stage shift register R(i), and the i-th-stage shift register R(i) is configured to provide a light-emitting control signal to the i-th row of sub-pixels. Herein, n is a positive integer, i is greater than or equal to 1 and less than or equal to n (i.e., 1≤i≤n), and i is an integer. For example, in a case where one light-emitting signal line is coupled to two rows of sub-pixels (referring to FIG. 1B), a (2i−1)-th row of sub-pixels and a 2i-th row of sub-pixels are coupled to the i-th shift register R(i). Here, i is greater than or equal to 1 and less than or equal to half of n (i.e., 1≤i≤n/2), and i is an integer. For example, a signal output terminal of each shift register may provide a light-emitting control signal to a control electrode of at least one transistor (e.g., the transistor M5 and the transistor M6 in the pixel circuit shown in FIG. 3) in each sub-pixel in at least one row of sub-pixels coupled to the signal output terminal.

Figure 11:
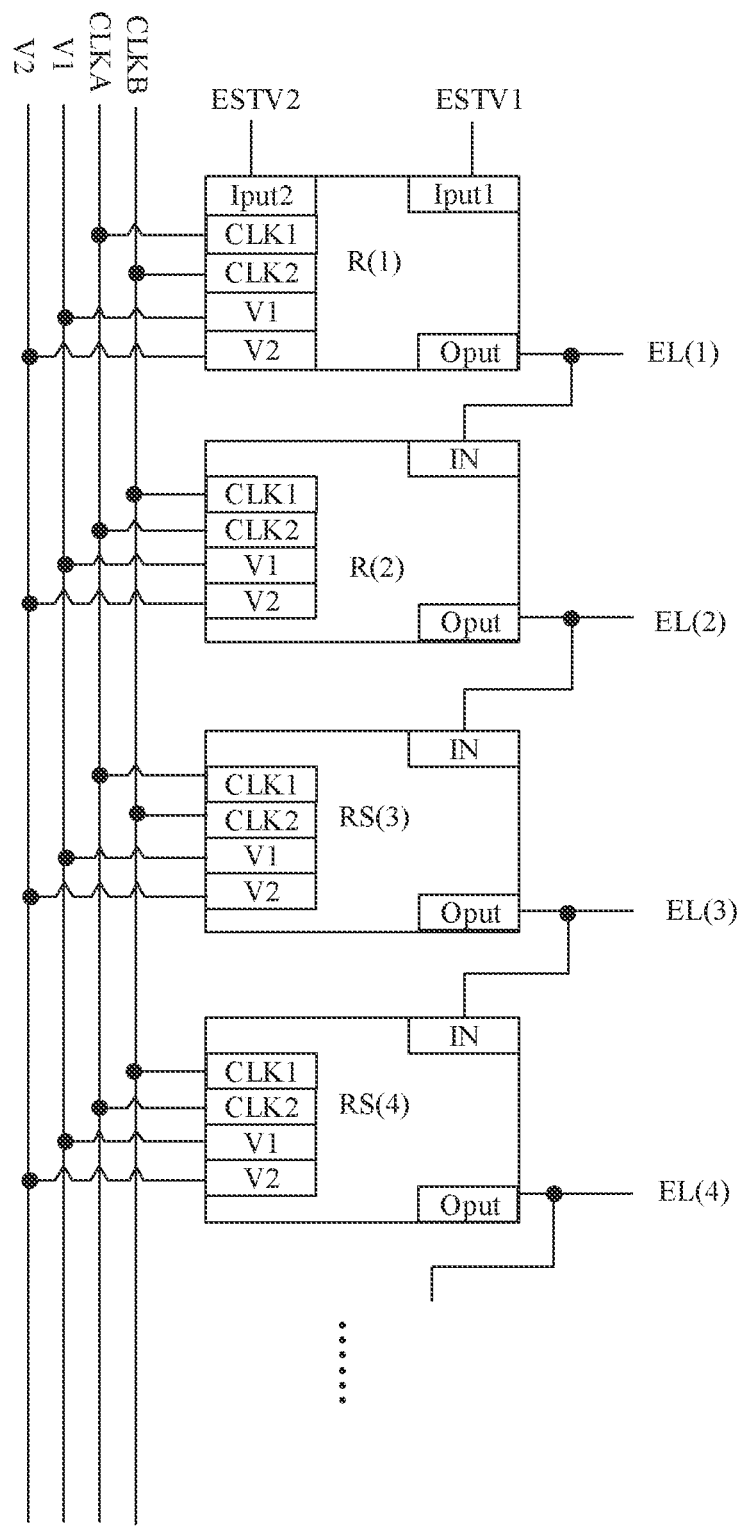
FIG. 11 is a structural diagram of a light-emitting control driving circuit, in accordance with some embodiments.

In a case where the plurality of shift registers are cascaded in sequence, for example, as shown in FIG. 11, the signal output terminal Oput of the first-stage shift register R(1) is coupled to an input terminal IN of a second-stage shift register R(2). The second-stage shift register R(2) is adjacent to the first-stage shift register R(1). A signal output terminal Oput of the second-stage shift register R(2) is coupled to an input terminal IN of a third-stage shift register R(3). The third-stage shift register R(3) is adjacent to the second-stage shift register R(2). In addition, the remaining shift registers are cascaded in the same way as described above.

An operating method of the first-stage shift register R(1) is the same as that of the shift register SR described above, and details will not be described here. For example, the first-stage shift register R(1) provides a light-emitting control signal to control electrodes of transistors, coupled to the first-stage shift register R(1), in a first row of sub-pixels. When outputting the signal, the signal output terminal Oput of the first-stage shift register R(1) further provides the signal to the input terminal IN of the second-stage shift register R(2) as an input signal of the second-stage shift register R(2), so that the second-stage shift register R(2) provides a light-emitting control signal to control electrodes of transistors, coupled to the signal output terminal Oput of the second shift register R(2), in a second row of sub-pixels. When outputting the signal, the signal output terminal Oput of the second shift register R(2) further provides the signal to an input terminal IN of the third-stage shift register R(3) as an input signal of a third-stage shift register R(3), so that the third-stage shift register R(3) provides a light-emitting control signal to control electrodes of transistors, coupled to the signal output terminal Oput of the third-stage shift register R(3), in a third row of sub-pixels. In this way, the plurality of shift registers R that are cascaded may scan the multiple rows of sub-pixels that are arranged in sequence row by row.

Figure 12:
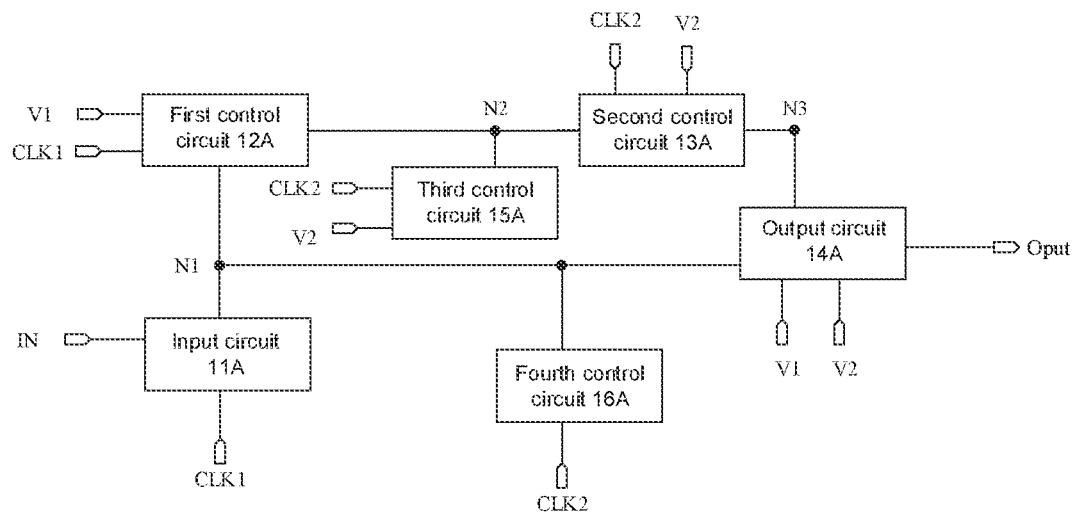
FIG. 12 is a structural diagram of yet another shift register, in accordance with some embodiments.

For example, in the light-emitting control driving circuit, except for the first-stage shift register, other shift registers each may adopt a shift register SRA shown in FIG. 12. As shown in FIG. 12, an input circuit 11A in the shift register SRA is coupled to a first clock signal terminal CLK1, an input terminal IN and a first node N1, and the input circuit 11A transmits a signal received at the input terminal IN to the first node N1 in response to a first clock signal received at the first clock signal terminal CLK1.

It will be noted that, other circuits in the shift register SRA (for example, referring to FIGS. 13A and 13B, a first control circuit 12A, a second control circuit 13A, an output circuit 14A, a third control circuit 15A, and a fourth control circuit 16A) each have the same structure and function as a corresponding circuit in the shift register SR described above, and details will not be repeated here.

Figure 13A:
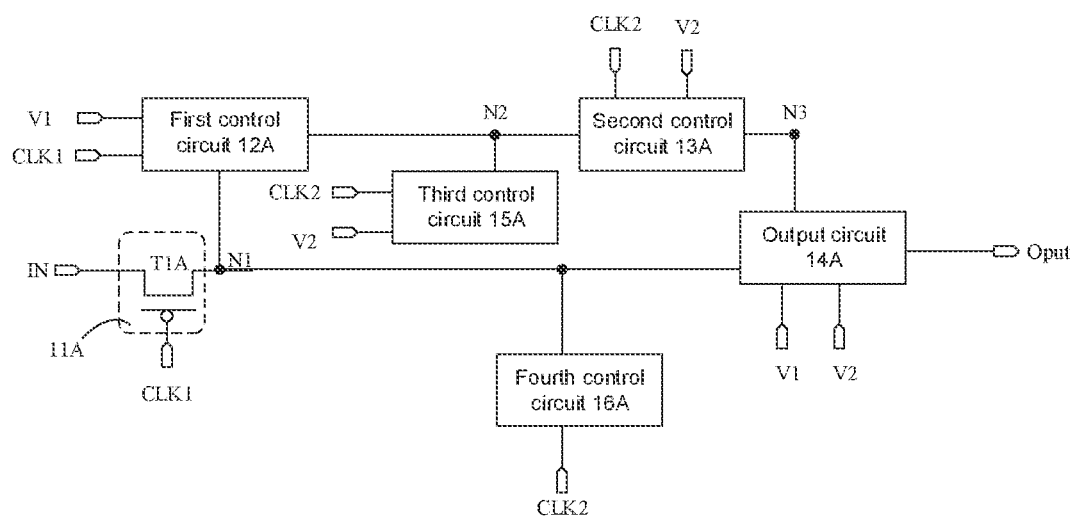
FIG. 13A is a structural diagram of yet another shift register, in accordance with some embodiments.
Figure 13B:
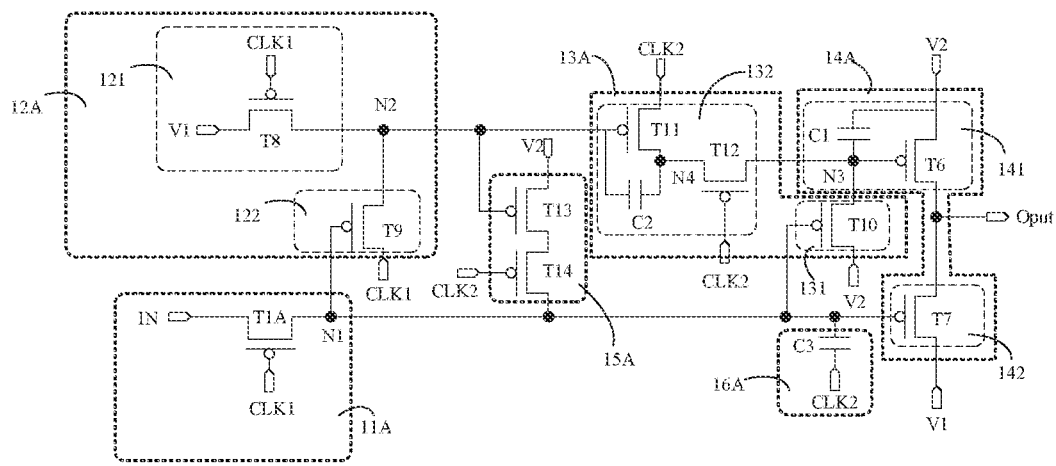
FIG. 13B is a structural diagram of yet another shift register, in accordance with some embodiments.

For example, as shown in FIGS. 13A and 13B, the input circuit 11A in the shift register SRA includes a first transistor T1A. A control electrode of the first transistor T1A is coupled to the first clock signal terminal CLK1, a first electrode of the first transistor T1A is coupled to the input terminal IN, and a second electrode of the first transistor T1A is coupled to the first node N1.

In this case, in the light-emitting control driving circuit 10, the first transistor T1A in the input circuit 11A of the second-stage shift register R(2) is turned on in response to the first clock signal, and transmits a signal received at the input terminal IN to the first node N1, so that the signal output terminal Oput of the second-stage shift register R(2) outputs a signal. The signal received at the input terminal IN of the second-stage shift register R(2) is the signal output by the signal output terminal Oput of the first-stage shift register R(1). For example, the signal output by the signal output terminal Oput of the first-stage shift register R(1) is the frequency-multiplied signal output by the shift register SR described above (e.g., referring to FIG. 9, the light-emitting control signal EM). In this case, the signal output by the signal output terminal Oput of the second-stage shift register R(2) may be a frequency-multiplied signal.

Correspondingly, the first transistor TIA in the input circuit 11A of the third-stage shift register R(3) is turned on in response to the first clock signal, and transmits a signal received at the input terminal IN to the first node N1, so that the signal output terminal Oput of the third-stage shift register R(3) outputs a signal. The signal received at the input terminal IN of the third-stage shift register R(3) is the signal output by the signal output terminal Oput of the second-stage shift register R(2). In a case where the signal output by the signal output terminal Oput of the second-stage shift register R(2) is a frequency-multiplied signal the signal output by the signal output terminal Oput of the third-stage shift register R(3) may also be a frequency-multiplied signal. In this way, signals output by other shift registers may also be frequency-multiplied signals.

In this case, the light-emitting control driving circuit may output frequency-multiplied signals row by row through the plurality of cascaded shift registers, thereby increasing the number of black frame insertions and the refresh frequency of the display panel.

It will be noted that, the above descriptions are made by taking an example in which one stage of shift register in the light-emitting control driving circuit controls one row (or column) of sub-pixels for display. In some other embodiments, one shift register may control at least two rows (or columns) of sub-pixels for display. In addition, the light-emitting control driving circuit may adopt gate driver on array (GOA) technology, so that the light-emitting control driving circuit may be arranged on the base substrate of the display panel.

As for the light-emitting control driving circuit, FIGS. 1A and 1B are merely illustrative by taking an example in which single-sided driving is adopted (that is, the light-emitting control driving circuit is provided on one side of the peripheral area of the display panel, and the sub-pixels are driven sequentially row by row from one side). In some other embodiments, double-sided simultaneous driving is adopted (that is, light-emitting control driving circuits are provided on two sides of the peripheral area of the display panel along a direction in which the signal lines for transmitting light-emitting control signals extend, and the sub-pixels are driven sequentially row by row from two sides simultaneously through the two light-emitting control driving circuits). In some other embodiments, double-sided alternate driving is adopted (that is, light-emitting control driving circuits are provided on two sides of the peripheral area of the display panel along a direction in which the signal lines for transmitting light-emitting control signals extend, and the sub-pixels are driven sequentially row by row from the two sides alternately through the two light-emitting control driving circuits) in the display panel. In the embodiments of the present disclosure, the light-emitting control driving circuit 10 provided in the embodiments is described by taking the single-sided driving as an example.

For example, first clock signal terminals and second clock signal terminals of any adjacent two cascaded shift registers are coupled to different first clock signal lines and second clock signal lines. For example, as shown in FIG. 11, first clock signal terminals CLK1 of odd-number-stage shift registers are coupled to a first clock signal line CLKA, and second clock signal terminals CLK2 of the odd-number-stage shift register are coupled to a second clock signal line CLKB; first clock signal terminals CLK1 of even-number-stage shift registers are coupled to the second clock signal line CLKB, and second clock signal terminals CLK2 of the even-number-stage shift registers are coupled to the first clock signal line CLKA.

It will be noted that, for convenience of description, some signal terminals, some signals transmitted by signal terminals, and some signal lines coupled to signal terminals are denoted by the same reference symbols, but have different attributes.

Figure 14:
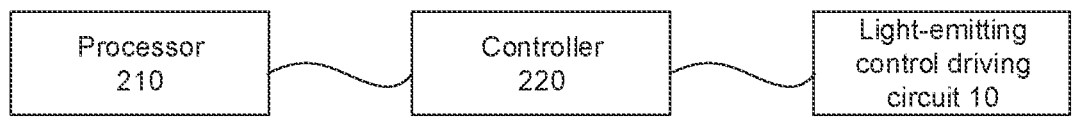
FIG. 14 is a structural diagram of yet another display apparatus, in accordance with some embodiments.

In some embodiments, as shown in FIG. 14, the display apparatus 200 further includes a processor 210 and a controller 220. The processor 210 is coupled to the controller 220, and the controller 220 is further coupled to the light-emitting control driving circuit 10.

For example, the processor 210 may include a central processing unit (CPU), a microprocessor, or an application specific integrated circuit (ASIC), etc. The controller 220 may include a timing controller (TCON) or a driver IC.

Figure 15A:
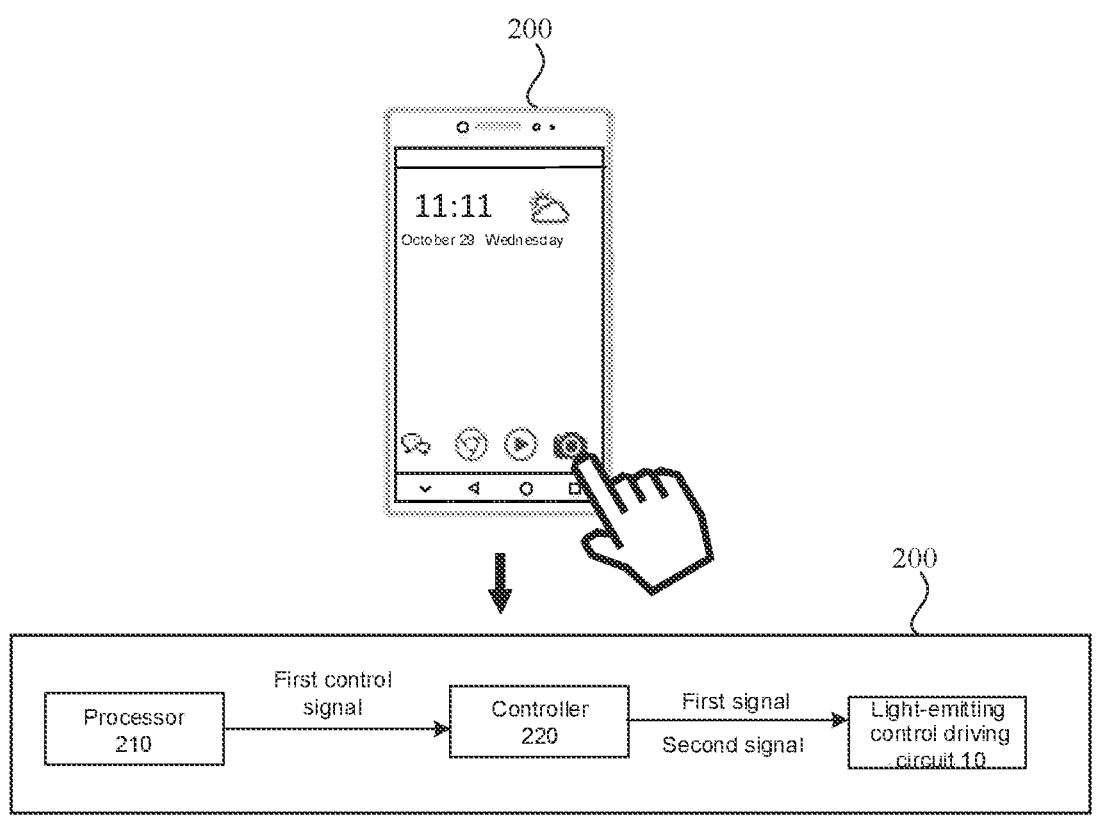
FIG. 15A is a schematic diagram showing an application scenario of a display apparatus, in accordance with some embodiments.
Figure 15B:
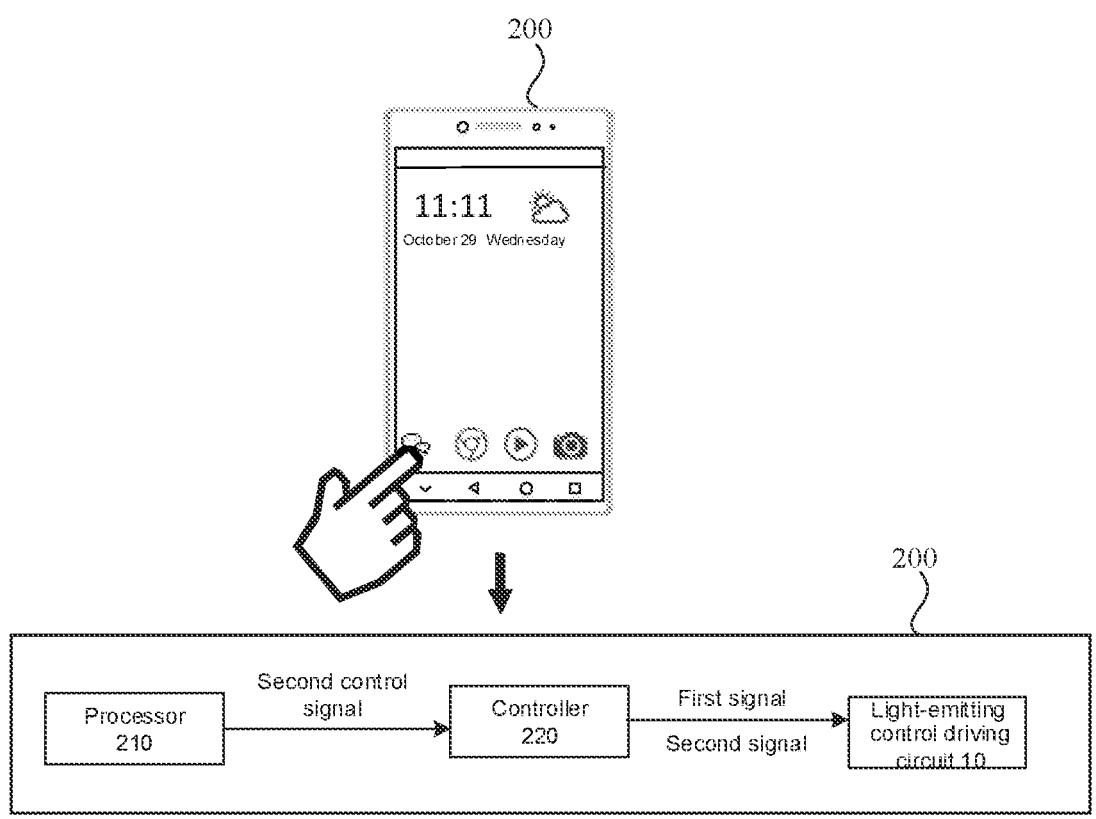
FIG. 15B is a schematic diagram showing another application scenario of a display apparatus, in accordance with some embodiments.

Referring to FIGS. 15A and 15B, the processor 210 is configured to output a first control signal and a second control signal to the controller 220.

Referring to FIG. 15A, the controller 220 is configured to transmit a first signal and a second signal to the light-emitting control driving circuit 10 in response to the first control signal. In the period of one frame, the first signal has a plurality of first pulses, the second signal has a plurality of second pulses, and the first pulse and the second pulse do not overlap at a same moment. For example, referring to FIG. 9, in the period of one frame (F), the first signal ESTV1 has four first pulses, the second signal ESTV2 has four second pulses, and there is an interval between each first pulse and each second pulse.

Referring to FIG. 15B, the controller 220 is further configured to transmit the first signal and the second signal to the light-emitting control driving circuit 10 in response to the second control signal. In the period of one frame, the first signal has a plurality of first pulses, and the second signal is a direct current signal. For example, referring to FIG. 10, in the period of one frame (F), the first signal ESTV1 has four first pulses, and the second signal ESTV2 is a direct current low-voltage signal.

For example, the processor 210 is configured to output the first control signal to the controller 220 in response to an operation of launching a specific application in a case where the specific application belongs to a preset collection, and output the second control signal to the controller 220 in response to the operation of launching the specific application in a case where the specific application does not belong to the preset collection.

The preset collection includes at least one application.

It will be noted that the preset collection may be set in advance according to the use condition of the actual product. For example, the application described above may be a software, such as a mobile application (an app). For example, the display apparatus may be pre-configured to have at least one application, or may acquire at least one application from a third-party application platform. The at least one application may include a picture taking application, a code scanning application, a video shooting application, or a screen recording application.

Specific applications are configured in the display apparatus. For example, the specific applications may be at least one application in the preset collection. For example, the specific applications include a picture taking application, a code scanning application, a video shooting application, or a screen recording application. Or, the specific applications may not be applications in the preset collection. For example, the specific applications may be a clock application, a weather forecast application, or a messaging application.

In some examples, referring to FIGS. 15A and 15B, there are icons of the specific applications on a user interaction interface displayed by the display apparatus, and the operation of launching the specific applications may be an operating of clicking on an icon of the specific applications by the user. For example, in a case where the specific application is a picture taking application, referring to FIG. 15A, there is a camera icon on the user interaction interface, and the operation of launching the specific application is an operation of clicking on the camera icon by the user, after which the specific application is launched. At this time, the display apparatus is in a picture taking state; the processor outputs the first control signal to the controller in response to the operation of launching the specific application (i.e., the operation of clicking on the icon) in a case where the picture taking application belongs to the preset collection.

For example, in a case where the specific application program is a messaging application, referring to FIG. 15B, there is a message icon on the user interaction interface. When the user clicks on the message icon, the specific application is launched. At this time, the display apparatus is in a messaging state; that is, the display apparatus is in a normal display state. The processor outputs the second control signal to the controller in response to the operation of launching the specific application in a case where the messaging application does not belong to the preset collection.

The embodiments of the present disclosure further provide a driving method of a shift register. The shift register may adopt the shift register SR described in any of the above embodiments.

Referring to FIG. 6A, the shift register SR includes the input circuit 11, the first control circuit 12, the second control circuit 13, and the output circuit 14. The input circuit 11 is coupled to the first signal input terminal Iput1, the second signal input terminal Iput2, the first clock signal terminal CLK1, and the first node N1. The first control circuit 12 is coupled to the first node N1, the first clock signal terminal CLK1, the first voltage terminal V1, and the second node N2. The second control circuit 13 is coupled to the first node N1, the second node N2, the second voltage terminal V2, the second clock signal terminal CLK2 and the third node N3. The output circuit 14 is coupled to the first node N1, the second node N2, the first voltage terminal V1, the second voltage terminal V2, and the signal output terminal Oput.

In this case, the driving method includes:
transmitting, by the input circuit, a first signal received at the first signal input terminal to the first node in response to a first clock signal received at the first clock signal terminal and a second signal received at the second signal input terminal; and transmitting, by the input circuit, the second signal received at the second signal input terminal to the first node in response to the first clock signal received at the first clock signal terminal and the first signal received at the first signal input terminal;

transmitting, by the first control circuit, the first clock signal received at the first clock signal terminal to the second node in response to a voltage of the first node; and transmitting, by the first control circuit, a first voltage of the first voltage terminal to the second node in response to the first clock signal;

transmitting, by the second control circuit, a second voltage of the second voltage terminal to the third node in response to the voltage of the first node; and transmitting, by the second control circuit, a second clock signal to the third node in response to a voltage of the second node and the second clock signal received at the second clock signal terminal; and transmitting, by the output circuit, the first voltage of the first voltage terminal to the signal output terminal in response to the voltage of the first node; and transmitting, by the output circuit, the second voltage of the second voltage terminal to the signal output terminal in response to a voltage of the third node.

In a period of a frame, the first signal has a plurality of first pulses, and the second signal has a plurality of second pulses. The first pulse and the second pulse do not overlap at a same moment.

For example, the plurality of first pulses and the plurality of second pulses are all arranged periodically. An interval between the second pulse and the first pulse adjacent to the second pulse is approximately half of an interval between two adjacent first pulses.

For example, in the period of a frame, the number of the plurality of first pulses and the number of the plurality of second pulses are both four. The interval between the second pulse and the first pulse adjacent to the second pulse is approximately one-eighth (⅛) of a duration of the period of a frame. For example, referring to FIG. 9, in the period of one frame (F), the duration of the period of one frame (F) is V, and the interval (W) between the first pulse of the first signal ESTV1 and the second pulse of the second signal ESTV2 is approximately one-eighth (⅛) of the duration V of the period of one frame (F); i.e., W=V/8. For example, in the period of one frame (F), a phase of the second pulse of the second signal ESTV2 is delayed from a phase of the first pulse of the first signal ESTV1 by approximately one-eighth (⅛) of the duration V of the period of one frame (F).

It will be noted that, the driving method of the shift register has the same beneficial effects as the shift register described above, and details will not be repeated here.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:
1. A shift register, comprising:
an input circuit coupled to a first signal input terminal, a second signal input terminal, a first clock signal terminal and a first node, the input circuit being configured to transmit a first signal received at the first signal input terminal to the first node in response to a first clock signal received at the first clock signal terminal and a second signal received at the second signal input terminal, and transmit the second signal received at the second signal input terminal to the first node in response to the first clock signal received at the first clock signal terminal and the first signal received at the first signal input terminal;
a first control circuit coupled to the first node, the first clock signal terminal, a first voltage terminal and a second node, the first control circuit being configured to transmit the first clock signal received at the first clock signal terminal to the second node in response to a voltage of the first node, and transmit a first voltage of the first voltage terminal to the second node in response to the first clock signal;

a second control circuit coupled to the first node, the second node, a second voltage terminal, a second clock signal terminal and a third node, the second control circuit being configured to transmit a second voltage of the second voltage terminal to the third node in response to the voltage of the first node, and transmit a second clock signal to the third node in response to a voltage of the second node and the second clock signal received at the second clock signal terminal; and an output circuit coupled to the first node, the third node, the first voltage terminal, the second voltage terminal and a signal output terminal, the output circuit being configured to transmit the first voltage of the first voltage terminal to the signal output terminal in response to the voltage of the first node, and transmit the second voltage of the second voltage terminal to the signal output terminal in response to a voltage of the third node.

2. The shift register according to claim 1, wherein the input circuit includes: a first input sub-circuit, a second input sub-circuit and a third input sub-circuit;

the first input sub-circuit is coupled to the first signal input terminal, the second signal input terminal and the third input sub-circuit, and the first input sub-circuit is configured to transmit the second signal to the third input sub-circuit in response to the first signal;

the second input sub-circuit is coupled to the first signal input terminal, the second signal input terminal and the third input sub-circuit, and the second input sub-circuit is configured to transmit the first signal to the third input sub-circuit in response to the second signal;

the third input sub-circuit is further coupled to the first clock signal terminal and the first node, and the third input sub-circuit is configured to transmit the second signal from the first input sub-circuit to the first node in response to the first clock signal, and transmit the first signal from the second input sub-circuit to the first node in response to the first clock signal.

3. The shift register according to claim 2, wherein the first input sub-circuit includes:

a first transistor, a control electrode of the first transistor being coupled to the first signal input terminal, a first electrode of the first transistor being coupled to the second signal input terminal, and a second electrode of the first transistor being coupled to the third input sub-circuit; and the second input sub-circuit includes:

a second transistor, a control electrode of the second transistor being coupled to the second signal input terminal, a first electrode of the second transistor being coupled to the first signal input terminal, and a second electrode of the second transistor being coupled to the third input sub-circuit.

4. The shift register according to claim 2, wherein the third input sub-circuit includes:

a third transistor, a control electrode of the third transistor being coupled to the first clock signal terminal, a first electrode of the third transistor being coupled to the first input sub-circuit and the second input sub-circuit, and a second electrode of the third transistor being coupled to the first node; or the third input sub-circuit includes:

a fourth transistor, a control electrode of the fourth transistor being coupled to the first clock signal terminal, a first electrode of the fourth transistor being coupled to the first input sub-circuit, and a second electrode of the fourth transistor being coupled to the first node; and a fifth transistor, a control electrode of the fifth transistor being coupled to the first clock signal terminal, a first electrode of the fifth transistor being coupled to the second input sub-circuit, and a second electrode of the fifth transistor being coupled to the first node.

5. The shift register according to claim 1, wherein the output circuit includes:

a first output sub-circuit coupled to the third node, the second voltage terminal and the signal output terminal, the first output sub-circuit being configured to transmit the second voltage to the signal output terminal in response to the voltage of the third node; and a second output sub-circuit coupled to the first node, the first voltage terminal and the signal output terminal, the second output sub-circuit being configured to transmit the first voltage to the signal output terminal in response to the voltage of the first node.

6. The shift register according to claim 5, wherein the first output sub-circuit includes:

a sixth transistor, a control electrode of the sixth transistor being coupled to the third node, a first electrode of the sixth transistor being coupled to the second voltage terminal, and a second electrode of the sixth transistor being coupled to the signal output terminal; and a first capacitor, a first terminal of the first capacitor being coupled to the third node, and a second terminal of the first capacitor being coupled to the second voltage terminal; or the second output sub-circuit includes:

a seventh transistor, a control electrode of the seventh transistor being coupled to the first node, a first electrode of the seventh transistor being coupled to the first voltage terminal, and a second electrode of the seventh transistor being coupled to the signal output terminal.

7. The shift register according to claim 1, wherein the first control circuit includes:

a first control sub-circuit coupled to the first clock signal terminal, the first voltage terminal and the second node, the first control sub-circuit being configured to transmit the first voltage to the second node in response to the first clock signal; and a second control sub-circuit coupled to the first node, the first clock signal terminal and the second node, the second control sub-circuit being configured to transmit the first clock signal to the second node in response to the voltage of the first node.

8. The shift register according to claim 7, wherein the first control sub-circuit includes:

an eighth transistor, a control electrode of the eighth transistor being coupled to the first clock signal terminal, a first electrode of the eighth transistor being coupled to the first voltage terminal, and a second electrode of the eighth transistor being coupled to the second node; and the second control sub-circuit includes:

a ninth transistor, a control electrode of the ninth transistor being coupled to the first node, a first electrode of the ninth transistor being coupled to the first clock signal terminal, and a second electrode of the ninth transistor being coupled to the second node.

9. The shift register according to claim 1, wherein the second control circuit includes:
   a third control sub-circuit coupled to the first node, the third node and the second voltage terminal, the third control sub-circuit being configured to transmit the second voltage to the third node in response to the voltage of the first node; and
   a fourth control sub-circuit coupled to the second node, the second clock signal terminal and the third node, the fourth control sub-circuit being configured to transmit the second clock signal to the third node in response to the voltage of the second node and the second clock signal.

10. The shift register according to claim 9, wherein the third control sub-circuit includes:
   a tenth transistor, a control electrode of the tenth transistor being coupled to the first node, a first electrode of the tenth transistor being coupled to the second voltage terminal, and a second electrode of the tenth transistor being coupled to the third node; and
   the fourth control sub-circuit includes:
   an eleventh transistor, a control electrode of the eleventh transistor being coupled to the second node, and a first electrode of the eleventh transistor being coupled to the second clock signal terminal:
   a twelfth transistor, a control electrode of the twelfth transistor being coupled to the second clock signal terminal, a first electrode of the twelfth transistor being coupled to a second electrode of the eleventh transistor, and a second electrode of the twelfth transistor being coupled to the third node; and
   a second capacitor, a first terminal of the second capacitor being coupled to the second node, and a second terminal of the second capacitor being coupled to the second electrode of the eleventh transistor and the first electrode of the twelfth transistor.

11. The shift register according to claim 1, further comprising:
   a third control circuit coupled to the second node, the second voltage terminal, the first node and the second clock signal terminal, the third control circuit being configured to transmit the second voltage of the second voltage terminal to the first node in response to the voltage of the second node and the second clock signal received at the second clock signal terminal.

12. The shift register according to claim 11, wherein the third control circuit includes:
   a thirteenth transistor, a control electrode of the thirteenth transistor being coupled to the second node, and a first electrode of the thirteenth transistor being coupled to the second voltage terminal; and
   a fourteenth transistor, a control electrode of the fourteenth transistor being coupled to the second clock signal terminal, a first electrode of the fourteenth transistor being coupled to a second electrode of the thirteenth transistor, and a second electrode of the fourteenth transistor being coupled to the first node.

13. The shift register according to claim 1, further comprising:
   a fourth control circuit coupled to the first node and the second clock signal terminal, the fourth control circuit being configured to control the voltage of the first node according to the second clock signal received at the second clock signal terminal.

14. The shift register according to claim 13, wherein the fourth control circuit includes:
   a third capacitor, a first terminal of the third capacitor being coupled to the second clock signal terminal, and a second terminal of the third capacitor being coupled to the first node.

15. A light-emitting control driving circuit, comprising a plurality of shift registers connected in cascade, wherein
   a first-stage shift register of the plurality of shift registers connected in cascade is the shift register according to claim 1.

16. A display apparatus, comprising the light-emitting control driving circuit according to claim 15.

17. The display apparatus according to claim 16, further comprising: a processor and a controller, the processor being coupled to the controller, wherein
   the processor is configured to output a first control signal and a second control signal to the controller;
   the controller is further coupled to the light-emitting control driving circuit:
   the controller is configured to transmit the first signal and the second signal to the light-emitting control driving circuit in response to the first control signal, wherein in a period of a frame, the first signal has a plurality of first pulses, the second signal has a plurality of second pulses, and a first pulse and a second pulse do not overlap at a same moment; and
   the controller is further configured to transmit the first signal and the second signal to the light-emitting control driving circuit in response to the second control signal, wherein in a period of a frame, the first signal has a plurality of first pulses, and the second signal is a direct current signal.

18. A driving method of a shift register, the shift register including an input circuit, a first control circuit, a second control circuit, and an output circuit, the input circuit being coupled to a first signal input terminal, a second signal input terminal, a first clock signal terminal and a first node, the first control circuit being coupled to the first node, the first clock signal terminal, a first voltage terminal and a second node, the second control circuit being coupled to the first node, the second node, a second voltage terminal, a second clock signal terminal and a third node, and the output circuit being coupled to the first node, the third node, the first voltage terminal, the second voltage terminal and a signal output terminal,
   the driving method comprising:
   transmitting, by the input circuit, a first signal received at the first signal input terminal to the first node in response to a first clock signal received at the first clock signal terminal and a second signal received at the second signal input terminal; and transmitting, by the input circuit, the second signal received at the second signal input terminal to the first node in response to the first clock signal received at the first clock signal terminal and the first signal received at the first signal input terminal;
   transmitting, by the first control circuit, the first clock signal received at the first clock signal terminal to the second node in response to a voltage of the first node; and transmitting, by the first control circuit, a first voltage of the first voltage terminal to the second node in response to the first clock signal:
   transmitting, by the second control circuit, a second voltage of the second voltage terminal to the third node in response to the voltage of the first node; and transmitting, by the second control circuit, a second clock signal to the third node in response to a voltage of the second node and the second clock signal received at the second clock signal terminal; and transmitting, by the output circuit, the first voltage of the first voltage terminal to the signal output terminal in response to the voltage of the first node; and transmitting, by the output circuit, the second voltage of the second voltage terminal to the signal output terminal in response to a voltage of the third node, wherein in a period of a frame, the first signal has a plurality of first pulses, the second signal has a plurality of second pulses, and a first pulse and a second pulse do not overlap at a same moment.

19. The driving method according to claim 18, wherein the plurality of first pulses and the plurality of second pulses are both arranged periodically; and an interval between the second pulse and the first pulse adjacent to the second pulse is approximately half of an interval between two adjacent first pulses.

20. The driving method according to claim 18, wherein in the period of the frame, a number of the plurality of first pulses and a number of the plurality of second pulses are both four; and an interval between the second pulse and the first pulse adjacent to the second pulse is approximately one-eighth of a duration of the period of the frame.

* * * * *